United States Patent
Gabrielsson et al.

(10) Patent No.: US 9,964,574 B2
(45) Date of Patent: May 8, 2018

(54) RESIDUAL CURRENT DETECTING (RCD) AND GROUND IMPEDANCE MONITORING TRANSFORMER AND CONTROL METHODS

(71) Applicant: AeroVironment, Inc., Monrovia, CA (US)

(72) Inventors: Peter Gabrielsson, Sierra Madre, CA (US); Albert Joseph Flack, Garden Grove, CA (US); Scott Berman, Los Angeles, CA (US)

(73) Assignee: AEROVIRONMENT, INC., Monrovia, CA (US)

( * ) Notice: Subject to any disclaimer, the term of this patent is extended or adjusted under 35 U.S.C. 154(b) by 0 days. days.

(21) Appl. No.: 15/614,059

(22) Filed: Jun. 5, 2017

(65) Prior Publication Data

US 2017/0350927 A1    Dec. 7, 2017

Related U.S. Application Data

(60) Provisional application No. 62/346,287, filed on Jun. 6, 2016.

(51) Int. Cl.
| | |
|---|---|
| *H02H 7/04* | (2006.01) |
| *G01R 27/18* | (2006.01) |
| *B60L 11/18* | (2006.01) |
| *G01R 31/00* | (2006.01) |
| *H02H 3/04* | (2006.01) |
| *H02H 7/045* | (2006.01) |

(52) U.S. Cl.
CPC .......... *G01R 27/18* (2013.01); *B60L 11/1809* (2013.01); *B60L 11/1838* (2013.01); *B60L 11/1881* (2013.01); *G01R 31/006* (2013.01); *H02H 3/044* (2013.01); *H02H 7/04* (2013.01); *H02H 7/045* (2013.01)

(58) Field of Classification Search
USPC .............................................. 361/35, 36, 38
See application file for complete search history.

(56) References Cited

U.S. PATENT DOCUMENTS

| | | |
|---|---|---|
| 4,278,940 A | 7/1981 | Milkovic |
| 4,616,174 A | 10/1986 | Jorgensen |
| (Continued) | | |

OTHER PUBLICATIONS

International Search Report for Serial No. PCT/US17/35951 dated Aug. 29, 2017.

*Primary Examiner* — Danny Nguyen

(74) *Attorney, Agent, or Firm* — Michael Zarrabian; Pejman Yedidsion; Eric Aagaard

(57) ABSTRACT

Systems, devices, and methods for a transformer including: a first drive winding (206) wound on a first core; a second drive winding wound on a second core; a sense winding wound across the first and second cores; and a compensation winding wound across the first and second cores; where one or more utility lines are threaded through a middle of the first and second cores, a common mode current in the one or more utility lines causes one or more pulses to appear on the sense winding, a current on the compensation winding is adjusted until the one or more pulses on the sense winding are cancelled out, and the common mode current on the one or more utility lines is the adjusted current on the compensation winding multiplied by a turn ratio between the compensation winding and the sense winding.

20 Claims, 18 Drawing Sheets

(56) References Cited

U.S. PATENT DOCUMENTS

| | | | | |
|---|---|---|---|---|
| 4,742,294 A | * | 5/1988 | Gallios | H01F 27/427 |
| | | | | 315/3.5 |
| 5,327,065 A | | 7/1994 | Bruni et al. | |
| 8,896,315 B1 | * | 11/2014 | Davies | H02J 7/0019 |
| | | | | 320/117 |

* cited by examiner

RESIDUAL CURRENT DETECTING (RCD) AND GROUND IMPEDANCE MONITORING TRANSFORMER AND CONTROL METHODS

CROSS-REFERENCE TO RELATED APPLICATIONS

This application claims priority to and the benefit of U.S. Provisional Patent Application No. 62/346,287, filed Jun. 6, 2016, the contents of which are hereby incorporated by reference herein for all purposes.

TECHNICAL FIELD

Embodiments relate generally to systems, methods, and devices for safe charging, and more particularly to residual current detection (RCD) and ground monitor interrupter (GMI).

BACKGROUND

Residual current detection (RCD) and ground monitor interrupter (GMI) are essential functions for safe charging of electric vehicles. The RCD is responsible for interrupting AC power should a conduction path to ground appear in the charging circuit. For example, a person touching live components of an electric vehicle (EV) may cause a conduction path to ground.

The GMI ensures that the ground connection between the EV charger and a utility is continuous and of low impedance. The GMI interrupts AC power to the EV if the ground connection is non-continuous or has high impedance. High impedance or open ground connections may result in dangerous high voltages appearing on the chassis of the EV.

Conventional methods for detecting residual leakage current rely on current transformers, which may be sensitive to AC leakage currents, but can saturate and fail to operate should DC leakage current be present. EV and solar installations may contain dangerously high DC voltages that may cause DC leakage current to be present.

SUMMARY

Exemplary device embodiments may include a transformer including: a first drive winding wound on a first core, where the first drive winding may be driven with a first high frequency square wave current; a second drive winding wound on a second core, where the second drive winding may be driven with a second high frequency square wave current, and where the second high frequency square wave current may have an opposite polarity of the first high frequency square wave current; a sense winding wound across the first and second cores; and a compensation winding wound across the first and second cores; where one or more utility lines are threaded through a middle of the first and second cores, wherein a common mode current in the one or more utility lines causes one or more pulses to appear on the sense winding, wherein a current on the compensation winding is adjusted until the one or more pulses on the sense winding are cancelled out, and wherein the common mode current on the one or more utility lines is the adjusted current on the compensation winding multiplied by a turn ratio between the compensation winding and the sense winding.

In additional device embodiments, a net flux through the sense winding may be zero if no common mode current is present on the one or more utility lines. A saturation flux density of the first core may be substantially equal to the saturation flux density of the second core. A saturation flux density of the first core may be within 10% of the saturation flux density of the second core. The first core may have a lower saturation flux density than the second core, and the first drive winding may be driven with less current than the second drive winding such that the first core saturates at substantially the same time as the second core. The first drive winding may apply a high frequency signal to the one or more utility lines and the second drive winding may measure an amplitude of a current that results, where the amplitude of the current that results may be proportional to a reciprocal of a ground loop impedance. The common mode current in the utility line may be at least one of: an AC residual leakage current and a DC residual leakage current. The first core may be disposed substantially parallel to the second core.

Exemplary method embodiments may include: providing a first high frequency square wave current to a first drive winding wound on a first core; providing a second high frequency square wave current to a second drive winding wound on a second core, where the second high frequency square wave current may have an opposite polarity of the first high frequency square wave current; sensing one or more pulses on a sense winding wound about the first and second cores, where the one or more pulses may be created by a common mode current on one or more utility lines threaded through the first and second cores; adjusting a current to a compensation winding wound about the first and second cores to cancel out the one or more pulses on the sense winding; and determining the common mode current on the one or more utility lines as the current on the compensation winding multiplied by a turn ratio between the compensation winding and the sense winding.

In additional method embodiments, a saturation flux density of the first core may be substantially equal to the saturation flux density of the second core. A saturation flux density of the first core may be within 10% of the saturation flux density of the second core. The first core may have a lower saturation flux density than the second core, and the first drive winding may be provided with less current than the second drive winding such that the first core saturates at substantially the same time as the second core.

Additional method embodiments may include: measuring one or more peaks of a rising edge of the sensed one or more pulses by a first sample and hold circuit; measuring one or more peaks of a falling edge of the sensed one or more pulses by a second sample and hold circuit; determining a difference in magnitude between an average of the peaks of the rising edges and an average of the peaks of the falling edges; and adjusting at least one of: the first high frequency square wave current and the second high frequency square wave current based on the determined difference in magnitude, where the adjusted current may compensate for a difference in a saturation flux density between the first core and the second core. Method embodiments may also include: providing a high frequency signal to the one or more utility lines by the first drive winding; and measuring an amplitude of a current that results by the second drive winding, where the amplitude of the current that results may be proportional to a reciprocal of a ground loop impedance. The high frequency signal driven by the first drive winding may flow to a utility ground, to an electric vehicle service equipment (EVSE) through a ground wire, to ground filter capacitors of the EVSE and to ground filter capacitors of an electric vehicle (EV), to the second core, and to the first core. No signal may be measured by the second core if a resistance of the utility ground is too high or open. The common mode current in the utility line may be at least one of: an AC residual leakage current and a DC residual leakage current.

Exemplary system embodiments may include: a microcontroller; a transformer including: a first drive winding wound on a first core, where the first drive winding may be driven with a first high frequency square wave current by the microcontroller; a second drive winding wound on a second core, where the second drive winding may be driven with a second high frequency square wave current by the microcontroller, and where the second high frequency square wave current may have an opposite polarity of the first high frequency square wave current; a sense winding wound across the first and second cores; and a compensation winding wound across the first and second cores; one or more utility lines, where the one or more utility lines may be threaded through a middle of the first and second cores, where a common mode current in the one or more utility lines may cause one or more pulses to appear on the sense winding, where a current on the compensation winding may be adjusted by the microcontroller until the one or more pulses on the sense winding are cancelled out, and where the common mode current on the one or more utility lines may be the adjusted current on the compensation winding multiplied by a turn ratio between the compensation winding and the sense winding.

Additional exemplary system embodiments may include: an electric vehicle supply equipment (EVSE), where the microcontroller, transformer, and one or more utility lines are part of the EVSE; a relay, where the relay is part of the EVSE; where the microcontroller may determine if the common mode current exceeds a set threshold, where the microcontroller may send a signal to a relay to cut power between the EVSE and a utility when the determined set threshold is exceeded. The first drive winding may apply a high frequency signal to the one or more utility lines, where the second drive winding may measure an amplitude of a current that results, where the amplitude of the current that results may be proportional to a reciprocal of a ground loop impedance, where the high frequency signal driven by the first drive winding may flow to a utility ground, to the EVSE through a ground wire, to ground filter capacitors of the EVSE and to ground filter capacitors of an electric vehicle (EV), to the second core, and to the first core.

BRIEF DESCRIPTION OF THE DRAWINGS

The components in the figures are not necessarily to scale, emphasis instead being placed upon illustrating the principals of the invention. Like reference numerals designate corresponding parts throughout the different views. Embodiments are illustrated by way of example and not limitation in the figures of the accompanying drawings, in which.

DETAILED DESCRIPTION

The present system allows for a DC and AC sensitive transformer for detection of residual leakage current, and associated drive circuitry, which is also able to measure the impedance of the ground connection. The system can measure leakage currents as small as 6 mA with sub milliamp accuracy in the presence of charging currents as high as 80 A.

Figure 1:
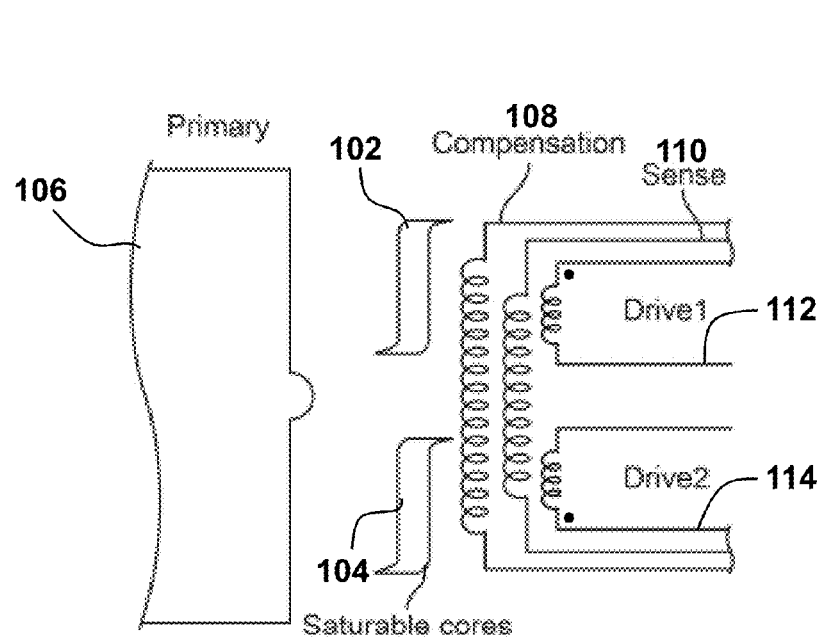
FIG. 1 depicts an electrical diagram of an exemplary transformer for detecting residual leakage current.

FIG. 1 depicts an electrical diagram 100 of an exemplary transformer for detecting residual leakage current. The transformer includes two saturable magnetic cores 102, 104. The cores may be made of a highly "square" magnetic material such as permalloy, metglass, supermalloy, nanoperm, mu-metal, etc. The transformer also includes one or more primary conductors 106. The transformer measures the common mode current on the one or more primary conductors 106. A compensation winding 108 may be wound on both cores 102, 104. The compensation winding 108 may be used to linearize the measurement of the common mode current. A sense winding 110 may also be wound on both cores. The sense winding may be used to determine a magnitude and direction of the common mode current on the one or more primary conductors 106. The transformer may also include a first drive winding 112 on the first core 102 and a second drive winding 114 on the second core 104. The drive windings 102, 104 may be used to drive their respective cores 102, 104 in and out of saturation. The drive windings 102, 104 may also be used to perform ground monitor interrupter (GMI) source and residual current detection (RCD) functions.

Figure 2:
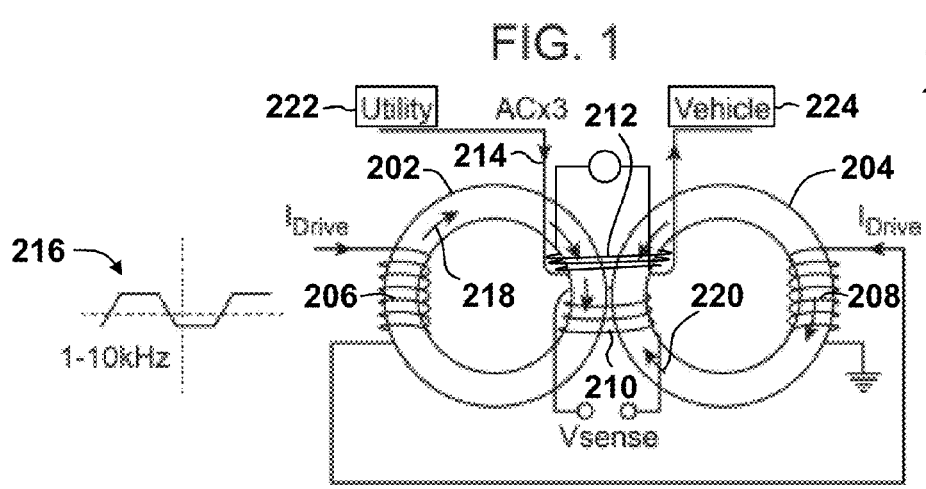
FIG. 2 depicts an exemplary transformer for detecting residual leakage current having two cores shown side-by-side.

FIG. 2 depicts an exemplary transformer 200 for detecting residual leakage current having two cores 202, 204 shown side-by-side. A first core 202 and a second core 204 may be made from a square hard saturating material, such as permalloy or metglass. The first core 202 and the second core 204 should reasonably well matched, particularly their saturation flux densities (Bmax). A first drive winding 206 is wound on the first core 202. A second drive winding 208 is wound on the second core 204. A sense winding 210 is wound across both cores 202, 204. A compensation winding 212 is also wound across both cores 202, 204. A utility line 214 is threaded through the middle of both cores 202, 204. The utility line 214 may be an AC conductor of an electric vehicle supply equipment (EVSE). The transformer 200 may be placed about the utility line 214 between a utility power source 222 and an electric vehicle (EV) 224. The magnetic field direction 218 of the first core 202 and the magnetic field direction 220 of the second core 204 are shown with arrows.

The cores 202, 204 are displayed side-by-side for illustration purposes. In some embodiments, the cores 202, 204 may be stacked on top of one another such that the first core 202 is substantially parallel to the second core 204.

The transformer 200 may provide residual current detection (RCD) functionality. Each of the drive windings 206, 208 may be driven with a high frequency square wave current 216. The current 216 may drive the cores 202, 204 into saturation. Once the cores saturate, the polarity of the drive current 216 may be reversed. As a result, the net flux through the sense winding 210 is zero since the flux from the drive currents 206, 208 is identical in the first core 202 and the second core 204, but of opposite polarity.

When a common mode, or leakage, current is present in the utility line 214, it adds to the flux in one core and subtracts from the flux in the other. This change in flux will cause one core to saturate before the other core, and the flux through the sense winding 210 no longer cancels. When one core saturates and the other doesn't saturate, the current in the drive windings 206, 208 will couple through the non-saturated core into the sense winding 210. Pulses will appear on the sense winding 210 every time the cores 202, 204 are driven into saturation. The amplitude and polarity of the pulses are indicative of the common mode current on the utility line 214.

Figure 3:
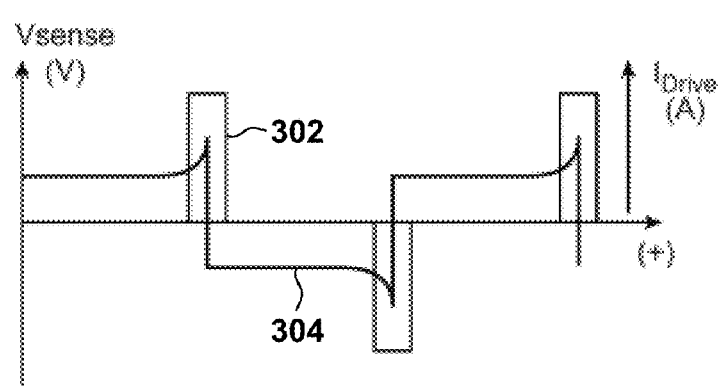
FIG. 3 depicts a graph of voltage on an exemplary sense winding and current in exemplary drive windings as cores of an exemplary transformer are driven in and out of saturation.

FIG. 3 depicts a graph 300 of voltage on an exemplary sense winding 302 and current in exemplary drive windings 304 as cores of an exemplary transformer are driven in and out of saturation.

Figure 4:
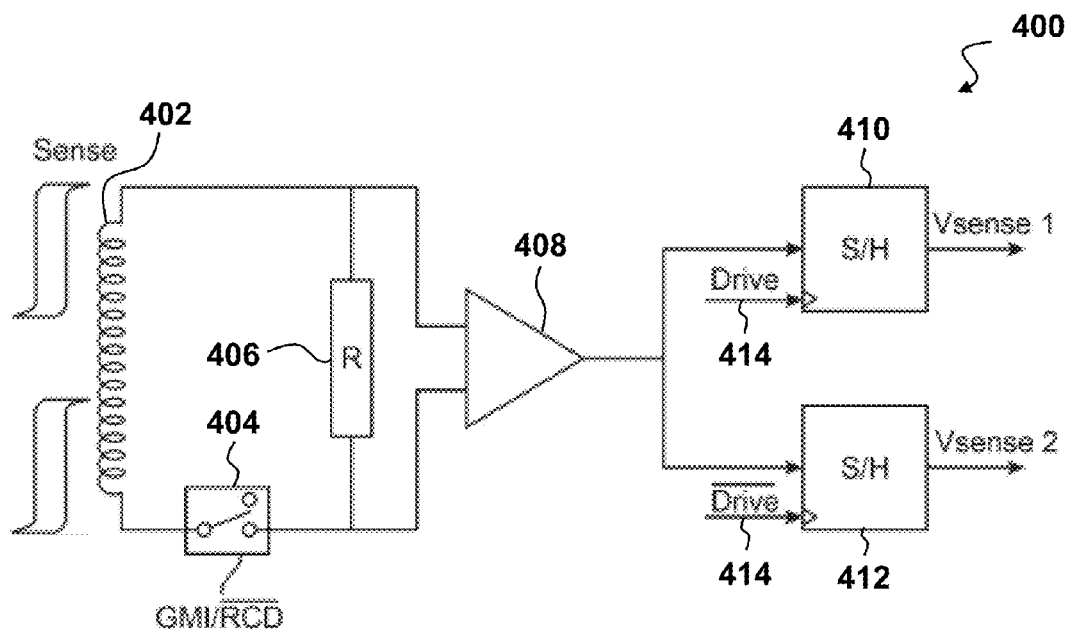
FIG. 4 depicts two sample and hold circuits for an exemplary sense winding.

FIG. 4 depicts two sample and hold circuits 400 for an exemplary sense winding. In RCD mode, the sense winding 402 is connected through a switch 404 to a burden resistor 406 and an amplifier 408. The voltage of the peaks on the sense winding, as shown in FIG. 3, is measured by two sample and hold (S/H) circuits 410, 412 that are alternately triggered by the rising edge the drive command signal 414, as shown in FIG. 3. The acquisition time of the S/H 410, 412 is matched to a pulse width of pulses on the sense winding 402.

Figure 5:
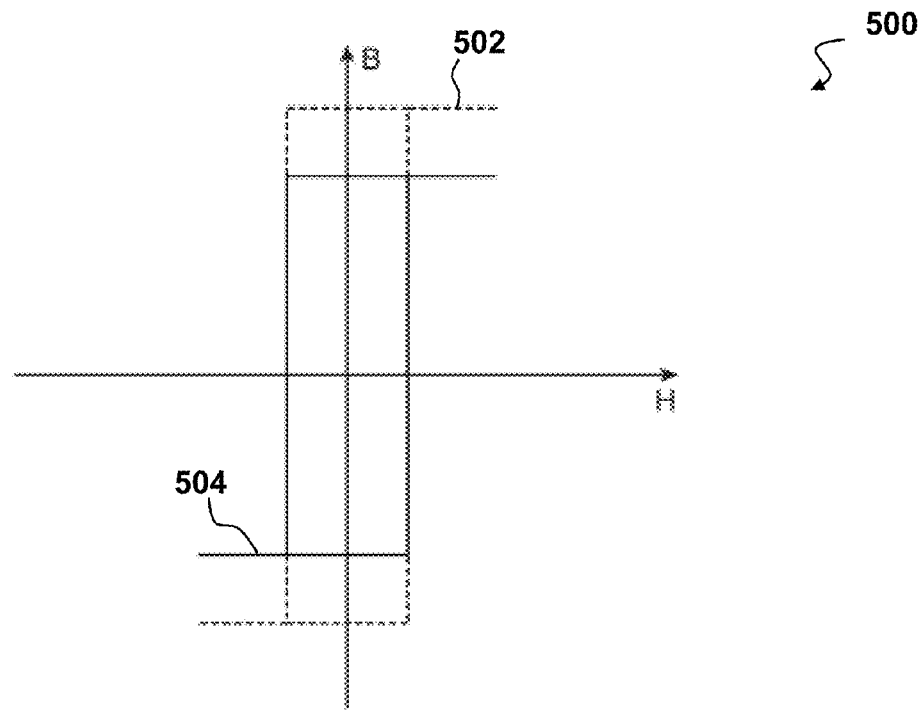
FIG. 5 depicts an idealized B-H curve of two poorly matched cores of a transformer driven in unison.

FIG. 5 depicts an idealized B-H curve 500 of two poorly matched cores 502, 504 of a transformer driven in unison. The B-H curve shows the relationship between magnetic flux density (B) and magnetic field strength (H) for each of the core 502, 504 materials. The first core 502 has a higher saturation flux density (Bsat) than the second core 504. Therefore, the first core 502 saturates later than the second core 504. A drive current on the first core 502 would couple into a sense winding of the transformer every time the cores 502, 504 saturate.

The disclosed transformer relies on the flux in the two cores being substantially equal, and so the cores need to be reasonably well matched, particularly their saturation flux density (Bmax). If the cores are not well matched, a spurious signal may appear on the sense winding even when there is no current flowing in the primary conductors. Temperature variation, age related drift, and external magnetic fields may cause similar spurious signals. These spurious signals must be detected and compensated for to prevent offsets in the leakage current measurement.

The signal from mismatched cores is different from a signal from an actual current flowing on the primary. In the case of a core mismatch, the core with the lower saturation flux density (Bsat) will always saturate first regardless of drive polarity, as long as there's no current in the primary. Having one core saturate before the other will result in the drive current from the other core coupling into the sense winding every time the core saturates. Since the drive current alternates between positive and negative, this will result in pulses on the sense winding of alternating polarity.

Figure 6:
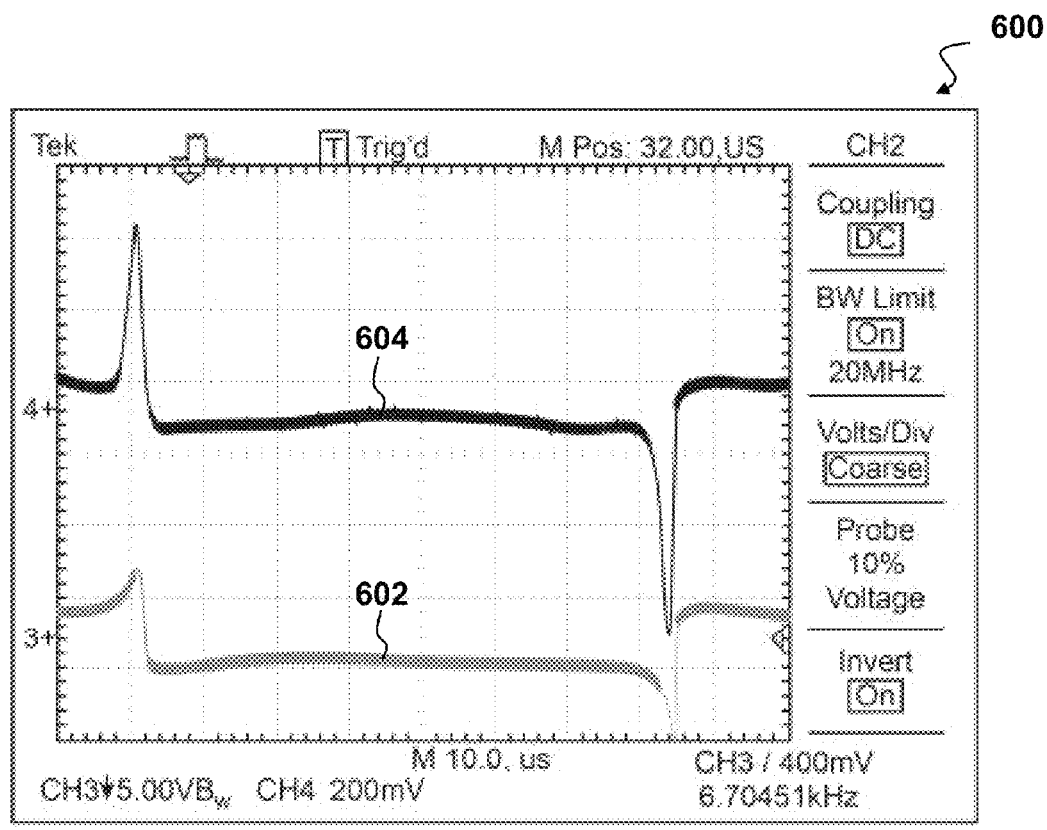
FIG. 6 depicts a graph of drive current and voltage on a sense winding for two poorly matched cores of a transformer driven in unison.

FIG. 6 depicts a graph 600 of drive current 602 and voltage 604 on a sense winding for two poorly matched cores of a transformer driven in unison. Mismatched cores, temperature drift and external magnetic fields may cause pulses of alternating polarity on the sense winding when the two cores of the transformer saturate.

Figure 7:
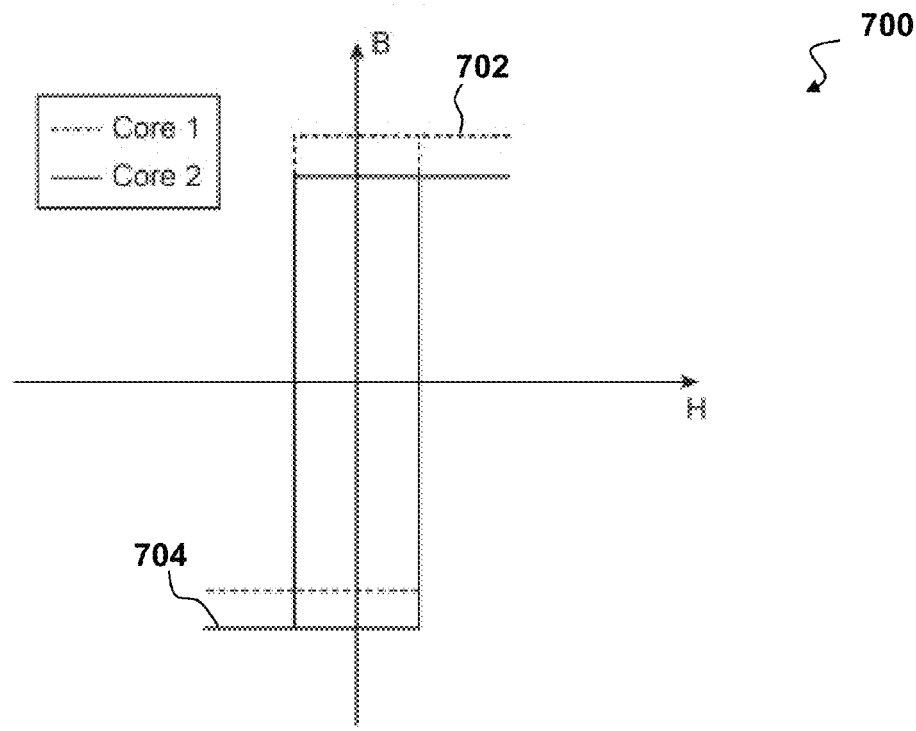
FIG. 7 depicts a B-H curve of two well-matched cores of a transformer driven in unison.

FIG. 7 depicts a B-H curve 700 of two well-matched cores 702, 704 of a transformer driven in unison. Two well-matched cores 702, 704 are shown in the presence of a common mode current on the primaries. When a positive drive current (H) is applied, the second core 704 saturates first and a drive current couples into the sense winding through the first core 702. When a negative drive current (H) is applied, the first core 702 saturates first and a drive current couples through the second core 704. The second core 704 is wound with opposite polarity from the first core 702 so the resulting pulse on the sense winding is again positive.

For matched cores 702, 704 in the presence of a common mode current on the primary, the core that saturates will alternate depending on the drive current direction. This alternating saturation results in the current in the first drive winding and the current in the second drive winding alternatingly coupling into the sense winding. The two drive windings are wound in opposing directions so the end result is that the pulses in the sense winding are of the same polarity.

Figure 8:
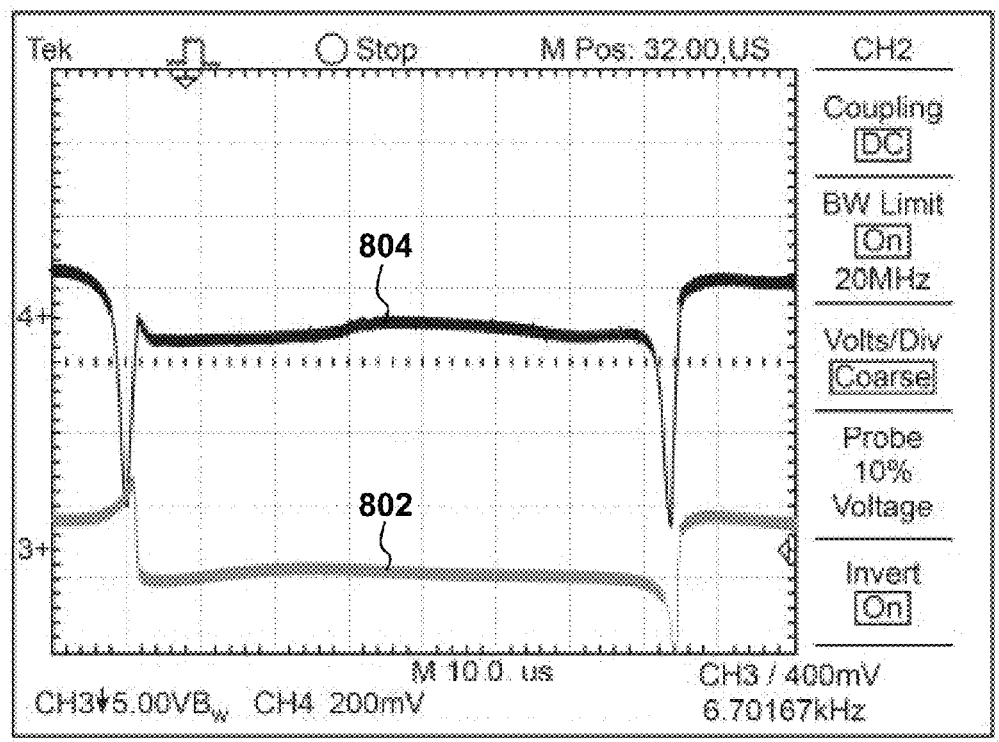
FIG. 8 depicts a graph of drive current and voltage on a sense winding for two well-matched cores of a transformer driven in unison with a DC leakage current present.

FIG. 8 depicts a graph 800 of drive current 802 and voltage 804 on a sense winding for two well-matched cores of a transformer driven in unison with a DC leakage current present. A common mode current in primary conductors results in pulses of the same polarity when the cores saturate.

Figure 9:
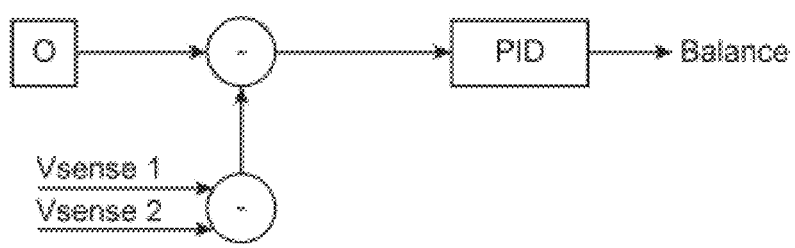
FIG. 9 depicts an exemplary circuit for balancing two cores of a transformer with individual drive currents.

FIG. 9 depicts an exemplary circuit 900 for balancing two cores of a transformer with individual drive currents. Both cores will never be perfectly matched. Compensating for some degree of mismatching between the cores may be achieved by driving the two cores with individual drive current. The core with the lower saturation flux density (Bsat) may be driven with less current than the core with higher Bsat. By varying the current to each of the cores based on their Bsat, both cores may be made to saturate at the same time and spurious signals may be eliminated or greatly reduced. Magnetic field (H) (At/m) is a function of current, and current through an inductor is a function of the product of voltage and time (Vs). Regulating the voltage that is applied to the drive winding allows for compensating for differences in Bsat between the two cores.

Figure 10:
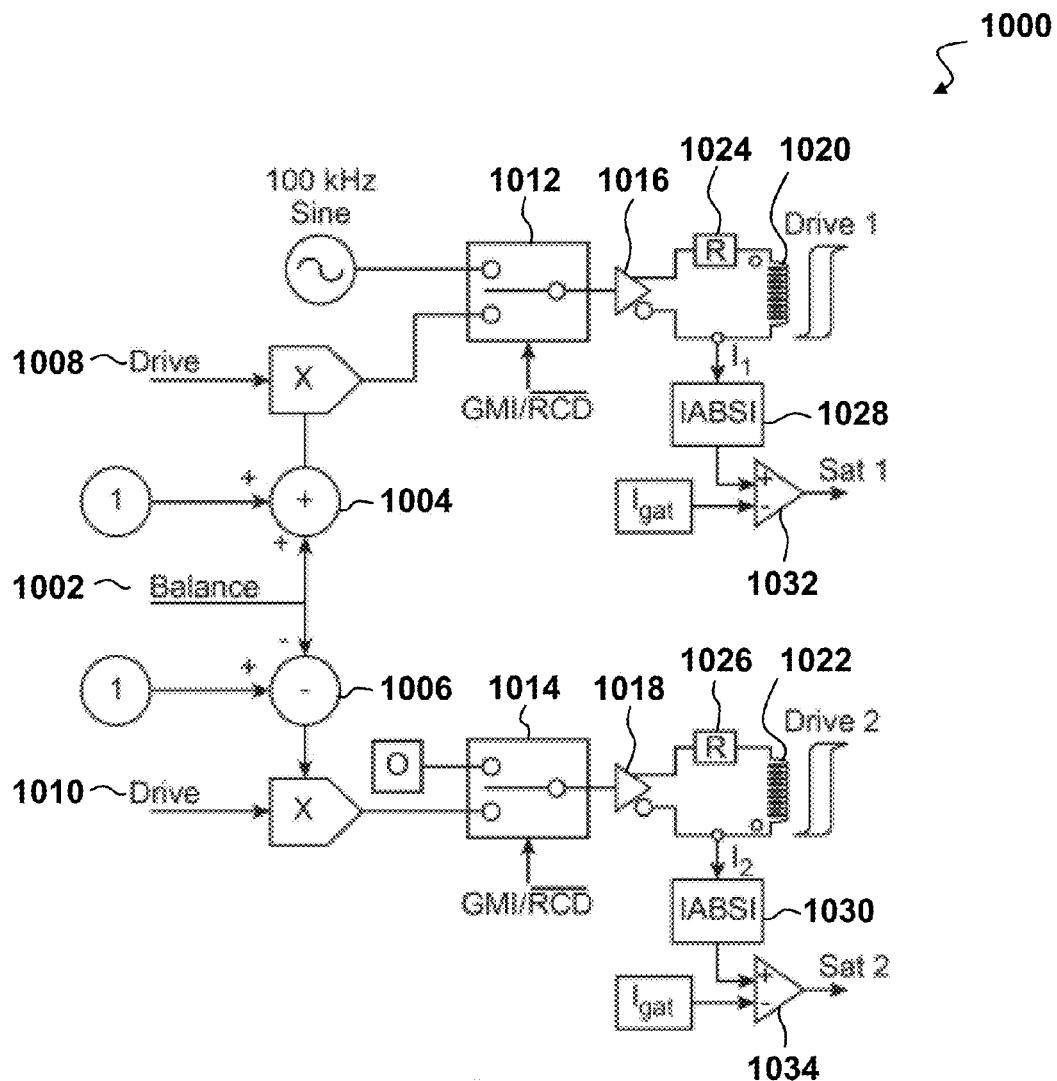
FIG. 10 depicts a circuit of exemplary drive winding drivers.

FIG. 10 depicts a circuit 1000 of exemplary drive winding drivers. A proportional-integral-derivative (PID), or similar, controller may be used to regulate out a difference in magnitude between two pulses measured by the sample and hold circuit as shown in FIG. 4.

An output of the balance controller 1002, as shown in FIG. 9, may be added 1004 to the magnitude of a drive command signal 1008 of one core, and subtracted from 1006 the magnitude of a drive command signal 1010 of the other core. The drive commands 1008, 1010 may be fed through selector switches 1012, 1014 to output drive buffers 1016, 108 that feed the drive windings 1020, 1022 through current limiting resistors 1024, 1026. The current through each drive winding 1020, 1022 is measured 1028, 1030; rectified; and sent to a comparator 1032, 1034 that compares it against a saturation threshold. When the drive current magnitude is higher than the set threshold, the core has saturated and the output of the comparator 1032, 1034 goes high.

Figure 11:
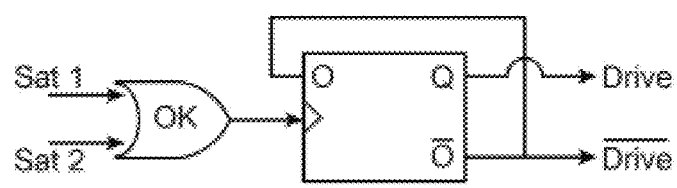
FIG. 11 depicts an exemplary flip flop circuit for changing polarity on a drive command signal and its inverse.

FIG. 11 depicts an exemplary flip flop circuit 1100 for changing polarity on a drive command signal and its inverse. The output of the two comparators causes a flip flop circuit to change polarity on the drive command signal (Drive) and it's inverse (!Drive).

Figure 12:
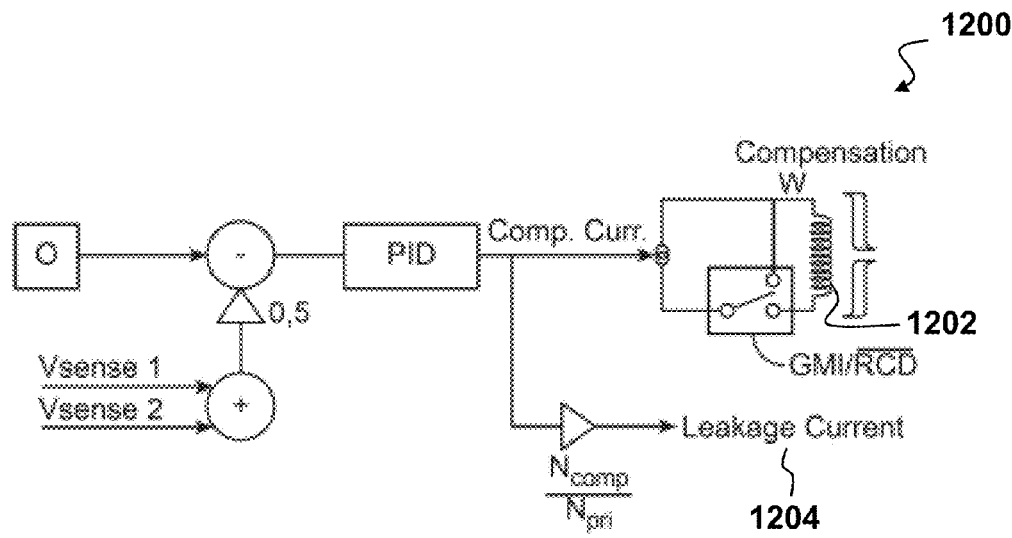
FIG. 12 depicts a circuit of an exemplary compensation winding of a transformer.

FIG. 12 depicts a circuit 1200 of an exemplary compensation winding of a transformer. The amplitude and polarity of the pulses on a sense winding of the transformer give an indication of the common mode current flowing on primary conductors. Due to the nonlinear nature of magnetic cores, the pulses on the sense winding do not provide an accurate measurement. In order to get an accurate measurement, a compensation winding 1202 is required. The current in the compensation winding 1202 is adjusted until the pulses on the sense winding go away, which can only happen when the current in the compensation winding 1202 perfectly matches the common mode current in the primary conductors. The primary current can therefore be calculated as the current in the compensation winding multiplied by the turn ratio between the two.

A PID, or similar, controller may be used to regulate out the average voltage of the pulses on the sense winding. The output of a regulator may be used to control a current source that drives a current through the compensation winding 1202 in RCD mode. The leakage current 1204, or the common mode current, in the primary conductors may be accurately determined as the output of the regulator multiplied by the turn-ratio of the compensation windings 1202 to the primary windings.

Figure 13:
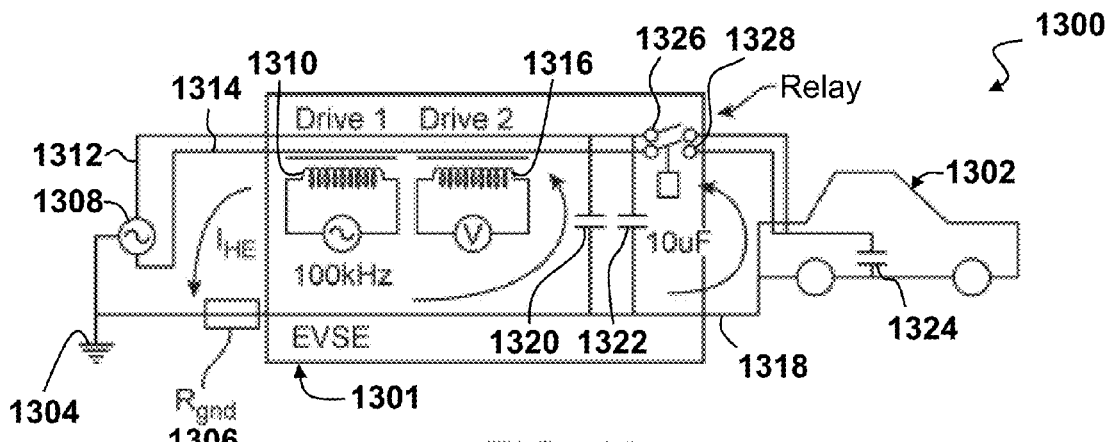
FIG. 13 depicts a circuit of an exemplary ground loop of an electric vehicle supply equipment (EVSE)

FIG. 13 depicts a circuit 1300 of an exemplary ground loop of an electric vehicle supply equipment (EVSE) 1301. For safety reasons, regulatory agencies, such as UL headquartered in Northbrook, Ill., requires the EVSE 1301 to verify that the EVSE 1301 and an electric vehicle (EV) 1302 are both properly grounded 1304. The ground connection 1304 between vehicle 1302 and EVSE 1301 may be verified by a pilot handshake signal, such as that specified in SAE J1772. A ground resistance 1306 between a utility 1308 and the EVSE 1301 must however be verified by other means.

In ground monitor interrupter (GMI) mode, the fluxgate transformer may be reconfigured as a signal generator and detector. A first core of the transformer and its respective drive winding 1310 may be used to apply a high frequency signal to the utility lines 1312, 1314. The second core of the transformer and its respective drive winding 1316 may be used to measure the amplitude of a current that results. The amplitude of the resulting current is proportional to a reciprocal of the ground loop impedance.

The high frequency current generated by the first drive winding 1310 flows through the utility transformer into ground 1304; back to the EVSE through the ground wire 1318; to ground filter capacitors 1320, 1322, 1324 of the EVSE 1301 and EV 1302, respectively; through the second core and back to the first core. If the resistance of the ground connection is too high, or open, no current can flow and no signal will be measured by the second core.

During the GMI test, the sense winding and compensation winding must be open circuit, which is accomplished by selector switches 1326, 1328. The drive circuit for the first drive winding 1310 is switched over to a high frequency signal source. The drive circuit for the second drive winding 1316 is held in a high impedance state.

Figure 14:
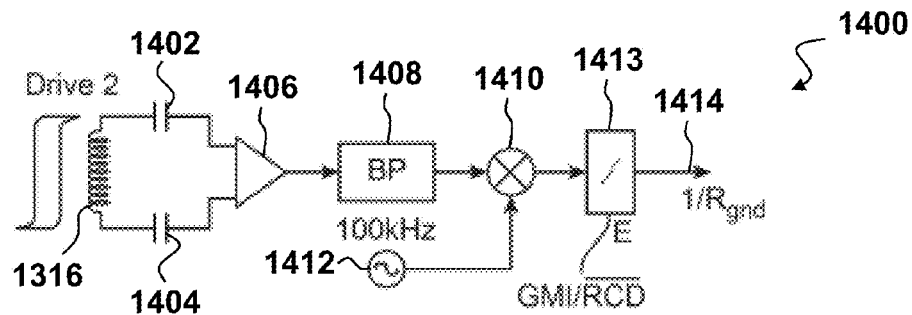
FIG. 14 depicts a circuit of an exemplary ground impedance monitoring (GMI) detector.

FIG. 14 depicts a circuit 1400 of an exemplary ground impedance monitoring (GMI) detector. The second drive winding 1316 is also connected to a detector circuit 1400 through DC blocking capacitors 1402, 1404.

An amplifier 1406 buffers the signal from the drive winding 1316 and feeds it through a bandpass filter 1408 with a center frequency around the high frequency source feeding the first drive winding 1316. The filtered signal is fed to a mixer 1410, the local oscillator input 1412 of which is fed by a high frequency signal. The high frequency signal 1412 is the same frequency as the drive, but with a different phase shift. The output of the mixer is integrated 1413 in order to measure the resulting DC signal magnitude. The output of the integrator 1414 is now proportional to the reciprocal of the ground loop impedance. The capacitive or inductive nature of the ground impedance can be determined by adjusting the phase shift of the local oscillator 1412.

Figure 15:
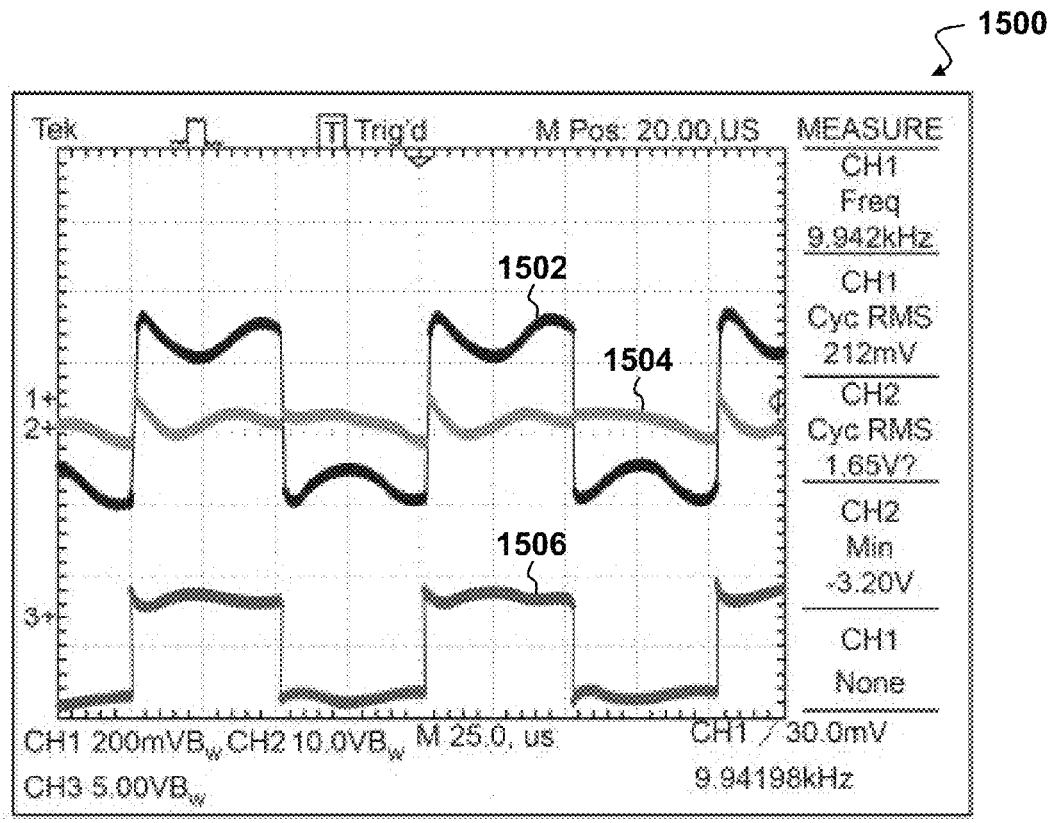
FIG. 15 depicts a graph of drive current, output voltage on a sense winding, and drive voltage of a transformer with well-matched cores and no current applied.

FIG. 15 depicts a graph 1500 of drive current 1502, output voltage 1504 on a sense winding, and drive voltage 1506 of a transformer with well-matched cores and no current applied. For a matched core test, a sensor was constructed from a pair of well matched cores (<0.5%). The drive winding may have 10 turns per core, the sense winding have may 10 turns, and a primary wire may be fed through the opening of both cores to measure the DC current in the primary wire. The drive winding is driven from a function generator at 10 kHz through a DC blocking capacitor and a 10 ohm resistor for measuring current. The output voltage 1504 is close to 0 as the flux in the two cores cancel.

Figure 16:
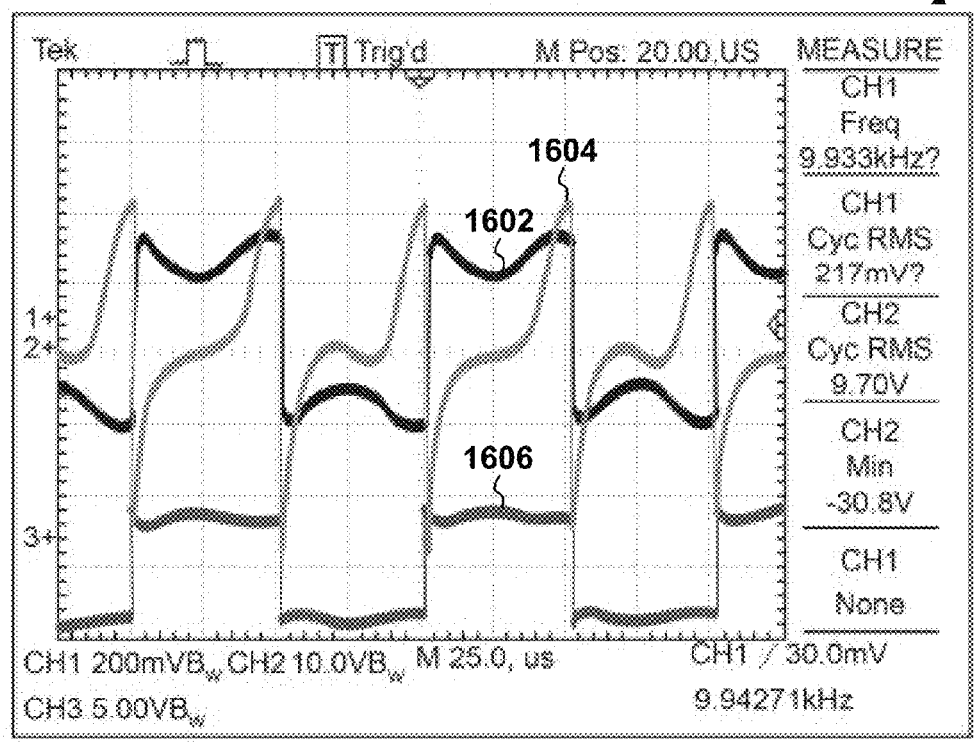
FIG. 16 depicts a graph of drive current, output voltage on a sense winding, and drive voltage of a transformer with well-matched cores and 6 mA current applied.

FIG. 16 depicts a graph 1600 of drive current 1602, output voltage 1604 on a sense winding, and drive voltage 1606 of a transformer with well-matched cores and 6 mA current applied. A significant output voltage 1604 can be seen on the sense winding when the fault current is applied, as compared to the output voltage on the sense winding with no current applied as in FIG. 15.

Figure 17:
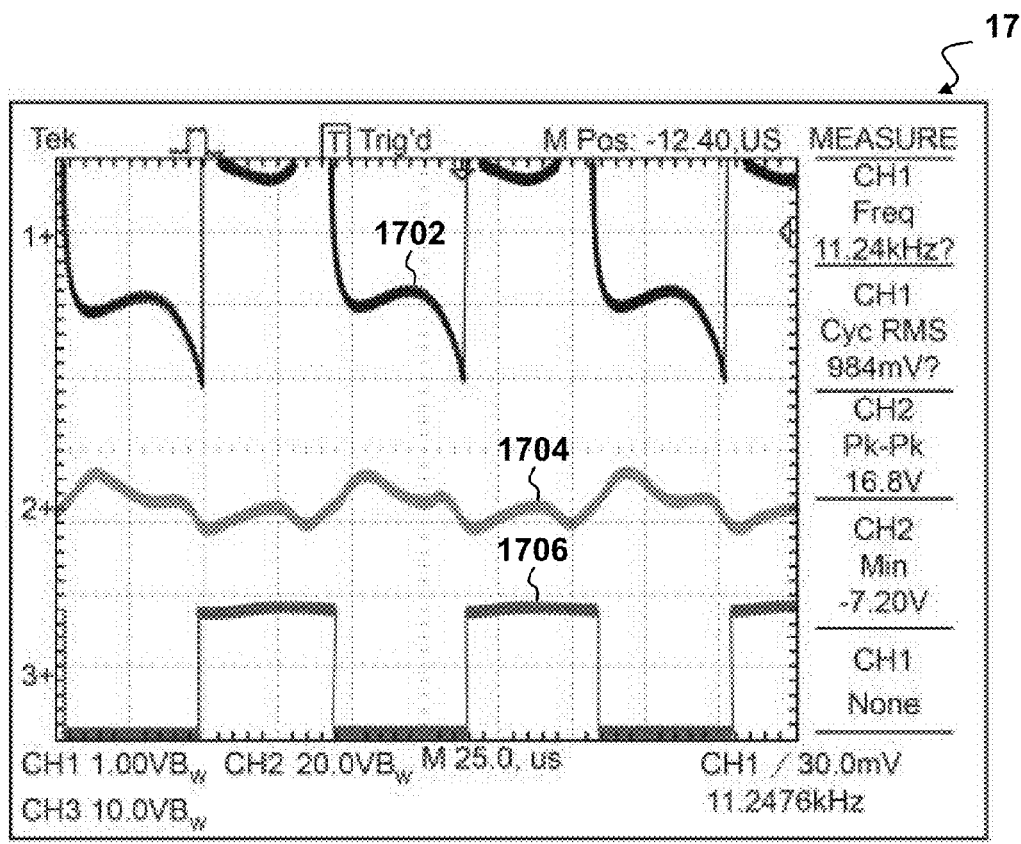
FIG. 17 depicts a graph of drive current, output voltage on a sense winding, and drive voltage of a transformer with unmatched cores and no current applied.

FIG. 17 depicts a graph 1700 of drive current 1702, output voltage 1704 on a sense winding, and drive voltage 1706 of a transformer with unmatched cores and no current applied. With no DC fault current applied, the unmatched cores produce noticeably greater signal amplitude than the matched cores, as shown in FIG. 15. The cores shown in graph 1700 have a matching error of 10%. Ideally, the cores may have a matching error of 5% or lower, but the cores may be balanced with a matching error of up to 10%. The transformer with these unmatched cores has twenty-turn drive windings, twenty-turn sense windings, and a single turn compensation winding on only one of the cores.

Figure 18:
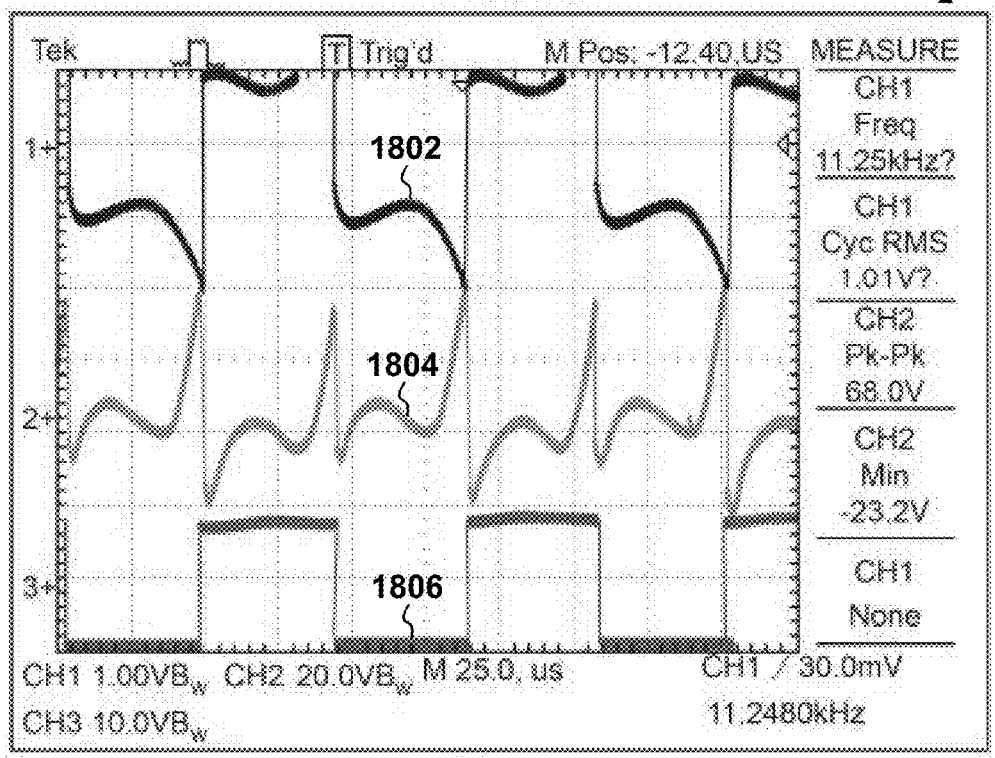
FIG. 18 depicts a graph of drive current, output voltage on a sense winding, and drive voltage of a transformer with unmatched cores and 6 mA current applied.

FIG. 18 depicts a graph of drive current 1802, output voltage 1804 on a sense winding, and drive voltage 1806 of a transformer with unmatched cores and 6 mA current applied. With 6 mA of DC fault current applied, the unmatched transformer produces less symmetrical output for rising and falling transition than the matched sensor, as shown in FIG. 16, but the signal amplitude remains significant. The most consistent signal component is the rapid transition of the drive current 1802 and output voltage 1804 around the rising edge of the drive voltage 1806 waveform. This signal may be fully and consistently canceled by adjusting the current in the compensation winding.

In some embodiments, the transformer may be subject to variations in temperature. After being heated for five minutes, the signal remained consistent. If anything, the amplitude of the signal became more symmetrical at the rising and falling edges. The compensation current necessary to cancel the output remained consistent with no significant (<10%) drift at 6 mA fault current. Both cores of the transformer tend to change temperature at the same rate due to their proximity and so any variations are largely cancelled out.

Figures 19, 20:
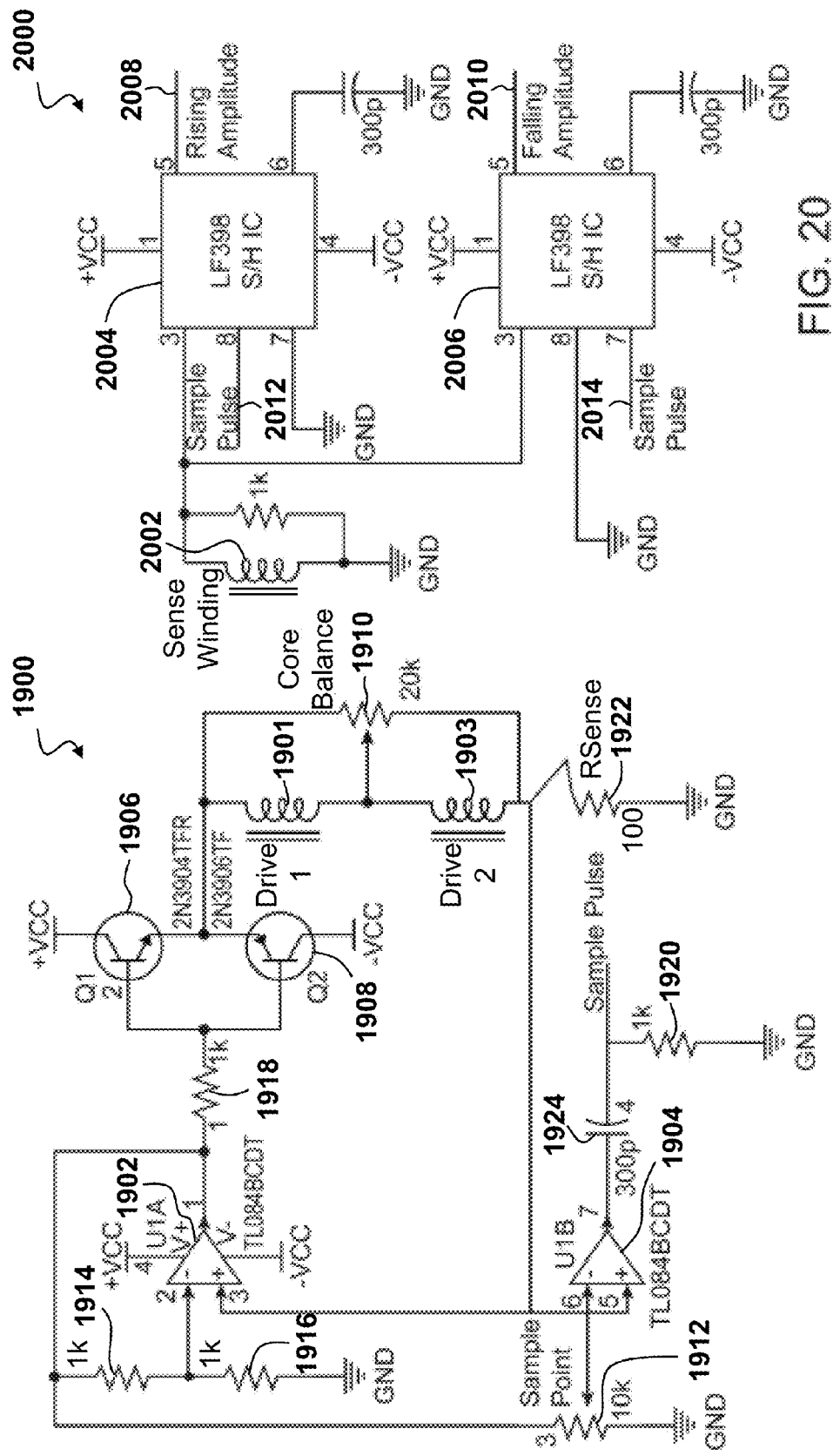
FIG. 19 depicts a circuit for generating a square wave for drive windings of a transformer.
FIG. 20 depicts two sample and hold circuits for an exemplary sense winding.

FIG. 19 depicts a circuit 1900 for generating a square wave for drive windings 1901, 1903 of a transformer. An analog device may be constructed to generate a signal for the drive windings using: a quad operational amplifier (op-amp) 1902; a sample and hold integrated circuit (IC) 1904; transistors 1906, 1908; potentiometers 1910, 1912 for tuning; resistors 1914, 1916, 1918, 1920, 1922; and capacitors 1924.

The drive circuit 1900 generates the square wave for the drive windings 1901, 1903. The op-amp 1902 used as a comparator applies a voltage to the drive windings 1901, 1903 through a buffer. When the cores saturate, the current rises rapidly and the voltage across Rsense 1922 exceeds the trip threshold for the comparator, which then trips and reverses the output voltage. This arrangement ensures that the cores are always driven to the same level of saturation regardless of supply voltage variations or core parameters.

A second comparator 1904 with an adjustable trip threshold is used to generate the sample pulse for the sample and hold circuit. The second comparator 1904 may be adjusted to trip just before the first comparator. The potentiometer 1910 is connected in parallel with the drive windings 1901, 1903, which makes it possible to compensate for the effect of poorly matched cores. The amount of current through each core can be adjusted so that the cores always saturate at the same time.

FIG. 20 depicts two sample and hold circuits 2000 for an exemplary sense winding 2002. A single sample and hold integrated circuit (IC) 2004 may be very sensitive to external magnetic fields and temperature drift. A second sample and hold IC 2006 allows both a rising edge 2008 and a falling edge 2010 of a pulse 2012, 2014 to be sampled. The average of the rising edge 2008 and the falling edge 2010 may be fed to a proportional-integral (PI) regulator.

Figure 21:
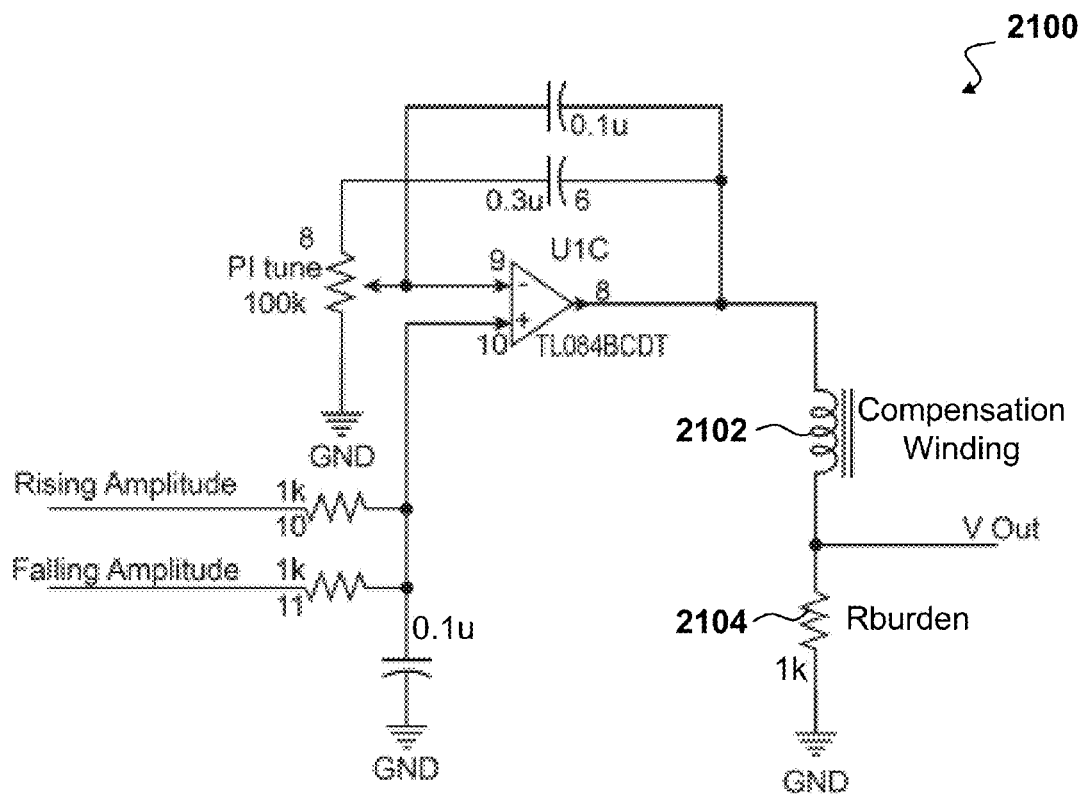
FIG. 21 depicts a circuit of an exemplary compensation controller of a transformer.

FIG. 21 depicts a circuit 2100 of an exemplary compensation controller of a transformer. The PI regulator tries to cancel out the signal from the sense winding by running a current through a compensation winding 2102, the current through the compensation winding 2102 is proportional to the DC leakage current when the PI error is zero. The voltage across the burden resistor Rburden 2104 is therefore a direct measurement of the leakage current.

Figure 22A:
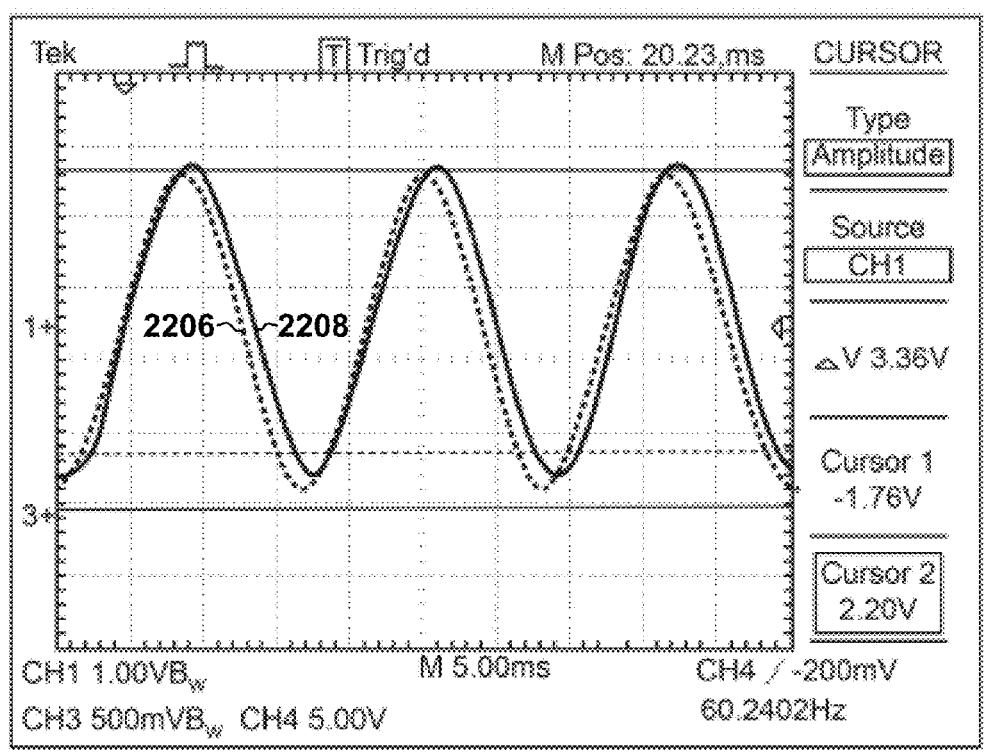
FIG. 22A depicts a graph of a sensor input and output for a 60 Hz sinewave.
Figure 22B:
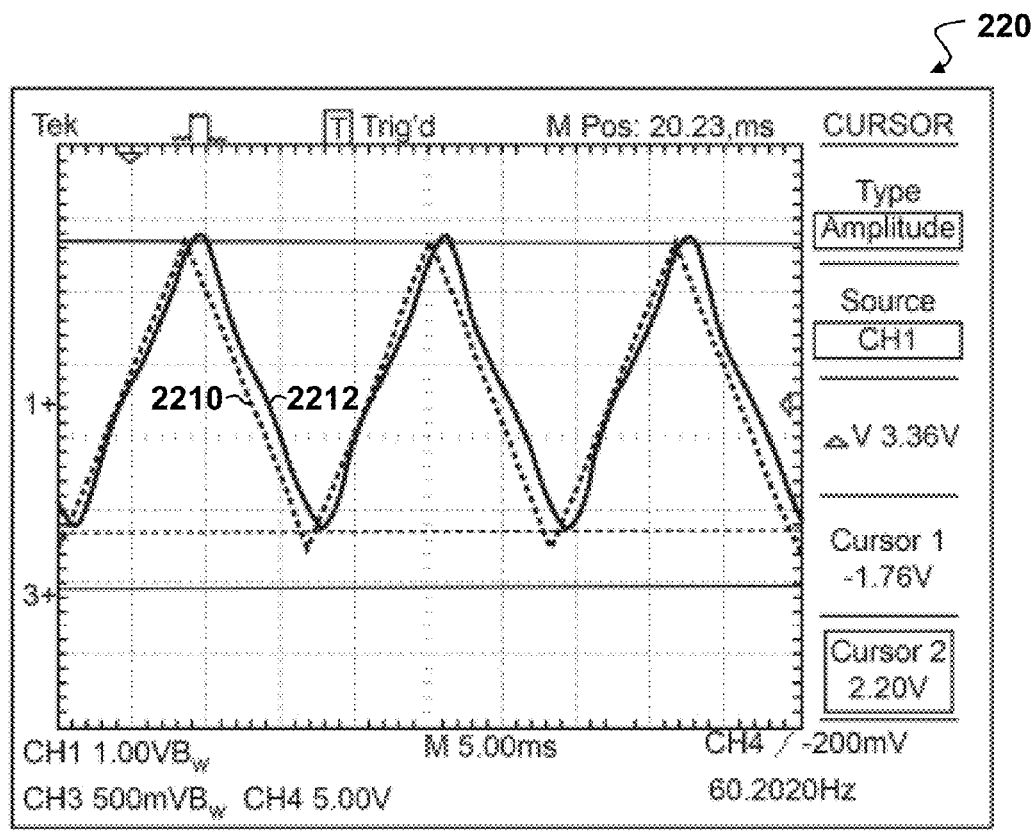
FIG. 22B depicts a graph of a sensor input and output for a 60 Hz triangle wave.
Figure 22C:
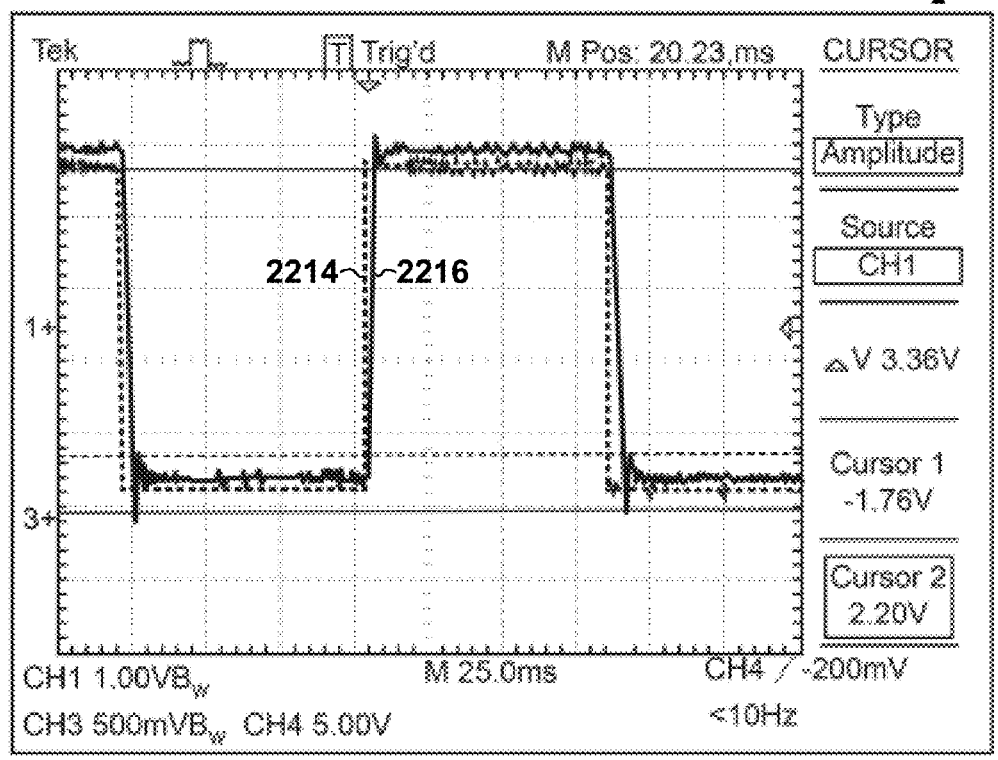
FIG. 22C depicts a graph of a sensor input and output for a 0.6 Hz square wave.

FIG. 22A depicts a graph 2200 of a sensor input 2206 and output 2208 for a 60 Hz sinewave. FIG. 22B depicts a graph 2202 of a sensor input 2210 and output 2212 for a 60 Hz triangle wave. FIG. 22C depicts a graph 2204 of a sensor input 2214 and output 2216 for a 0.6 Hz square wave. The transformer is able to measure up to 600 Hz without significant reduction in gain, and better tuning of the PI could improve that further.

Figure 23:
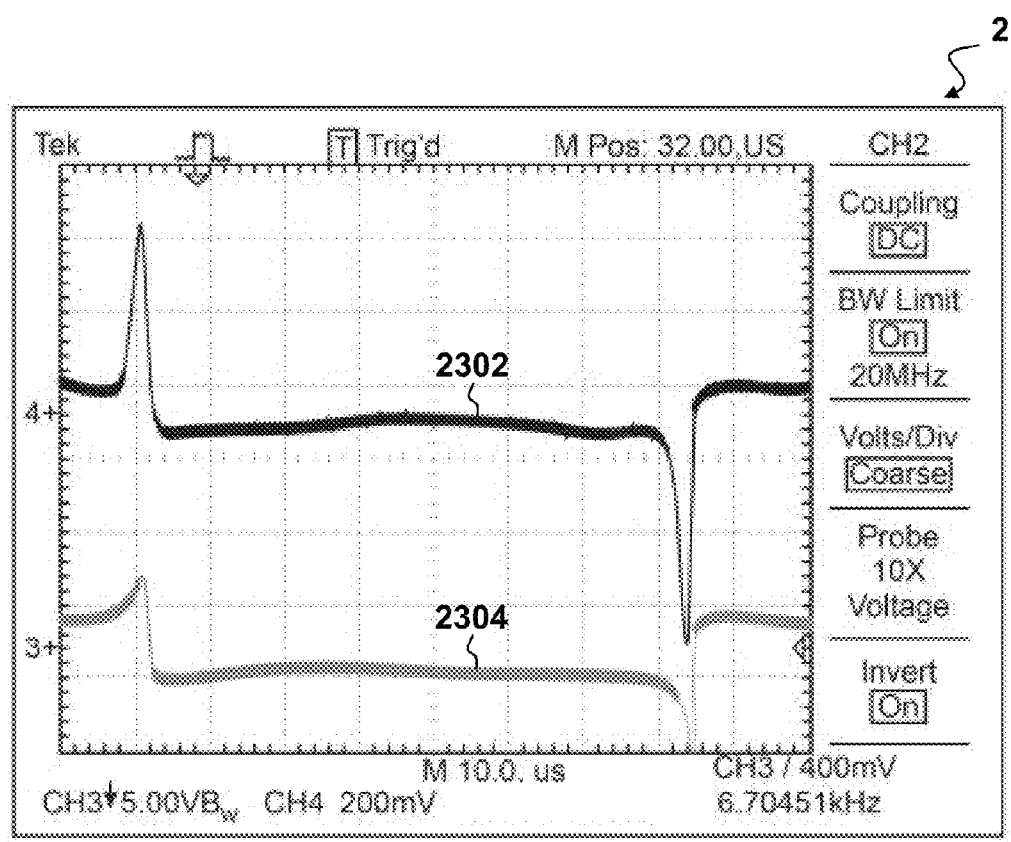
FIG. 23 depicts a graph of a sense winding signal caused by an external magnetic field.

FIG. 23 depicts a graph 2300 of a sense winding voltage 2302 and current 2304 signals caused by an external magnetic field. The transformer may be sensitive to external magnetic fields. External magnetic fields may have the same effect as poorly matched cores and temperature drift. External magnetic fields produce a differential signal between rising and falling edge pulses.

Figure 24:
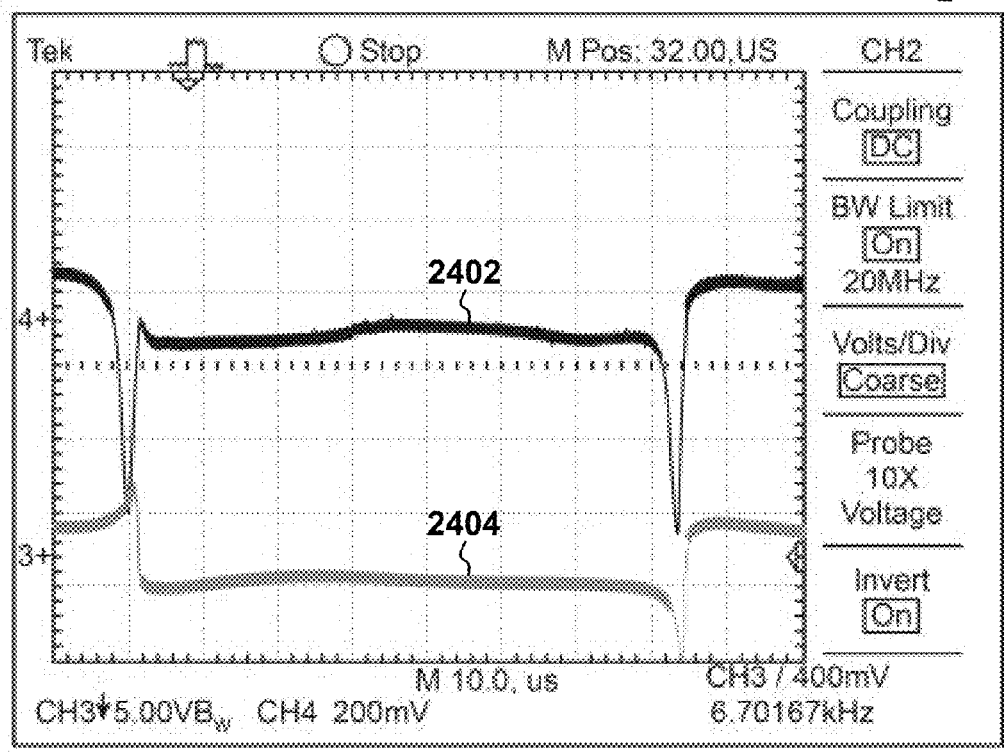
FIG. 24 depicts a graph of a leakage current producing a common mode signal.

FIG. 24 depicts a graph 2400 of a leakage voltage 2402 and current 2404 signals producing a common mode signal. The leakage signals 2402, 2404 produces a common mode signal. Adding a second sample and hold IC and regulating the average of the two pulses drastically reduces sensitivity to core matching, temperature drifts, and external fields. The differential signal caused by external fields may be tuned out using a core balance potentiometer. Dynamic control over the core balancing allows for tuning of the cores in response to changing external conditions. Tuned cores may produce less noise on the AC line and may be less susceptible to the noise on the AC line. Using two sampling circuits may eliminate spurious signals from core mismatch, temperature drift, and external magnetic fields.

Figure 25:
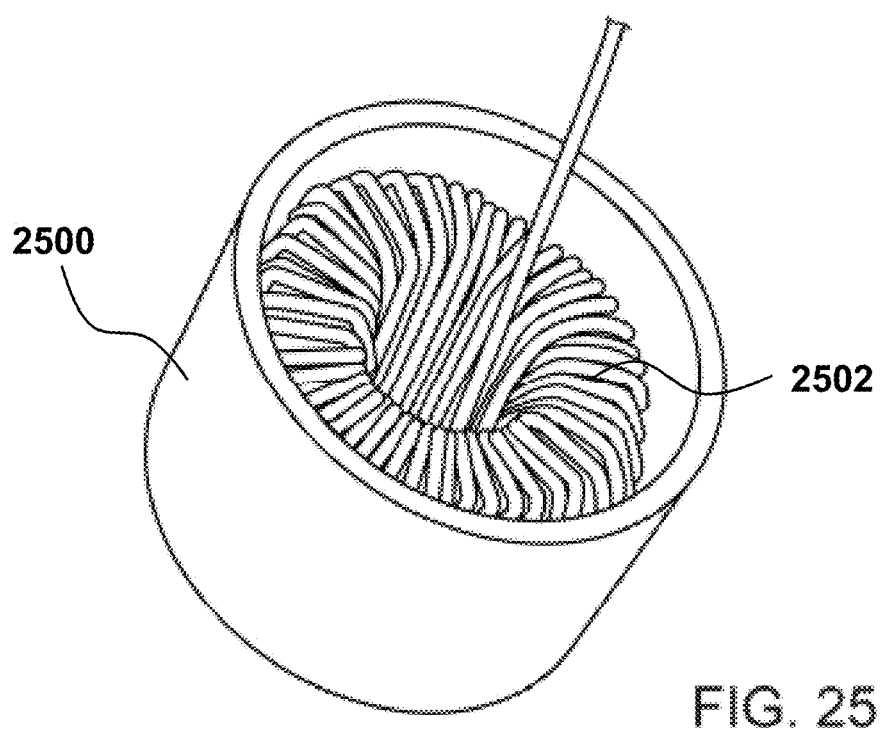
FIG. 25 depicts an exemplary shielding of an exemplary transformer to contain electromagnetic interference (EMI)

FIG. 25 depicts an exemplary shielding 2500 of an exemplary transformer 2502 to contain electromagnetic interference (EMI). A magnetic shield 2500 made of soft iron may be placed around the transformer 2502 to reduce and/or eliminate spurious signals caused by external magnetic fields. A cylindrical shield, such as a steel pipe, may be placed around the transformer 2502 to reduce the effects of external magnetic fields by an order of magnitude. The shielding 2500 may also contain any EMI caused by the constant switching of the drive windings and saturating cores. The magnetic shield 2500 greatly reduces sensitivity to external magnetic fields.

Figure 26:
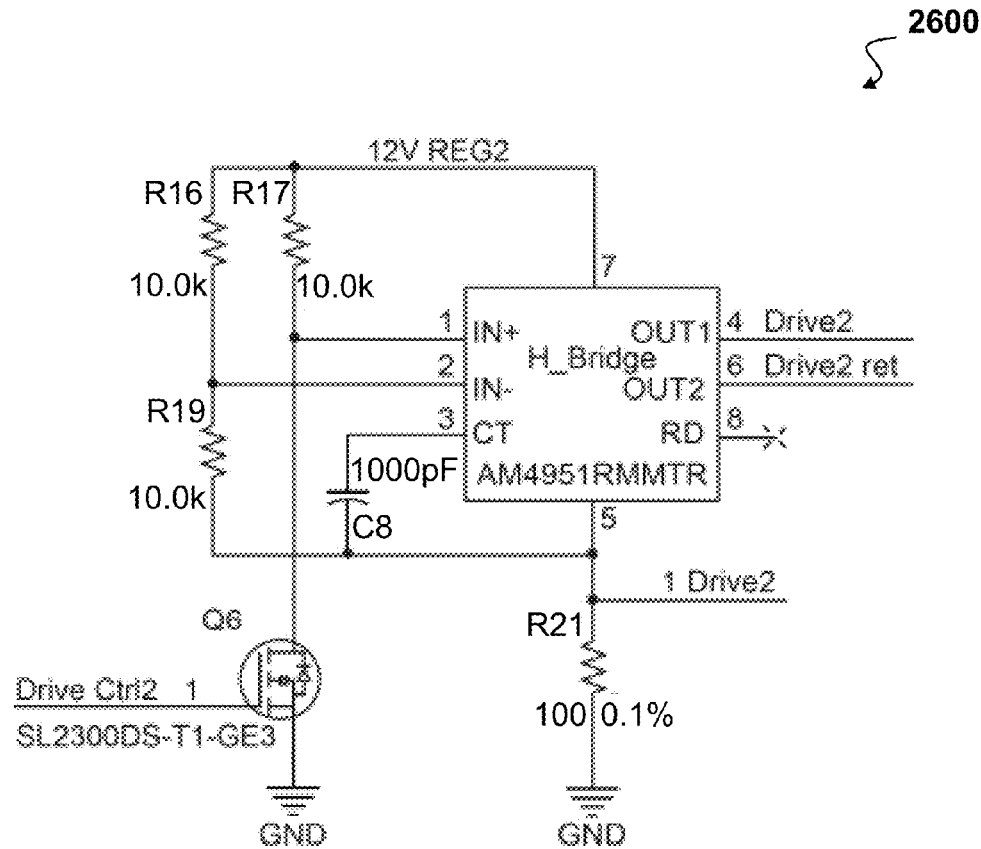
FIG. 26 depicts a circuit of an exemplary H-bridge driver.

FIG. 26 depicts a circuit 2600 of an exemplary H-bridge driver. An I_DriveX signal is a measurement of the drive current and may be fed to an analog comparator. A drive winding driver may use an off-the-shelf H-bridge. This circuit 2600 may not have GMI capability.

Figure 27:
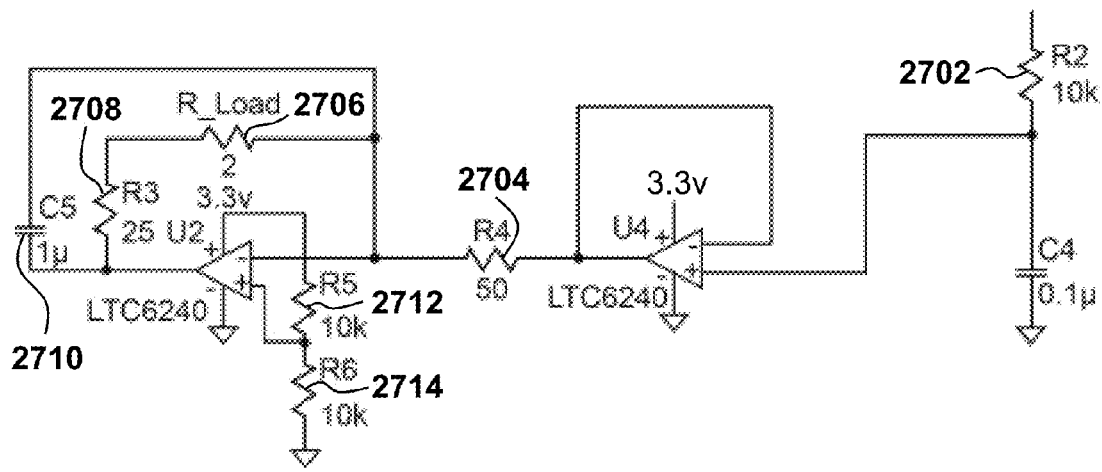
FIG. 27 depicts a circuit of an exemplary compensation winding driver.

FIG. 27 depicts a circuit 2700 of an exemplary compensation winding driver. A compensation winding current may be precisely controlled, as it provides the measurement of the leakage current. The circuit 2700 takes a pulse width modulation (PWM) proportional to desired current where 50%=0 current as its input. The PWM is applied to R2 2702. The filtered voltage across R4 2704 sets the current through the Rload 2706, which is the compensation winding. R3 2708 provides a minimum impedance and improves the effect of the filter capacitor C5 2710. R5 2712 and R6 2714 set the 0 current point. Rload 2706 is the compensation winding. This circuit 2700 may not have GMI functions.

Figure 28:
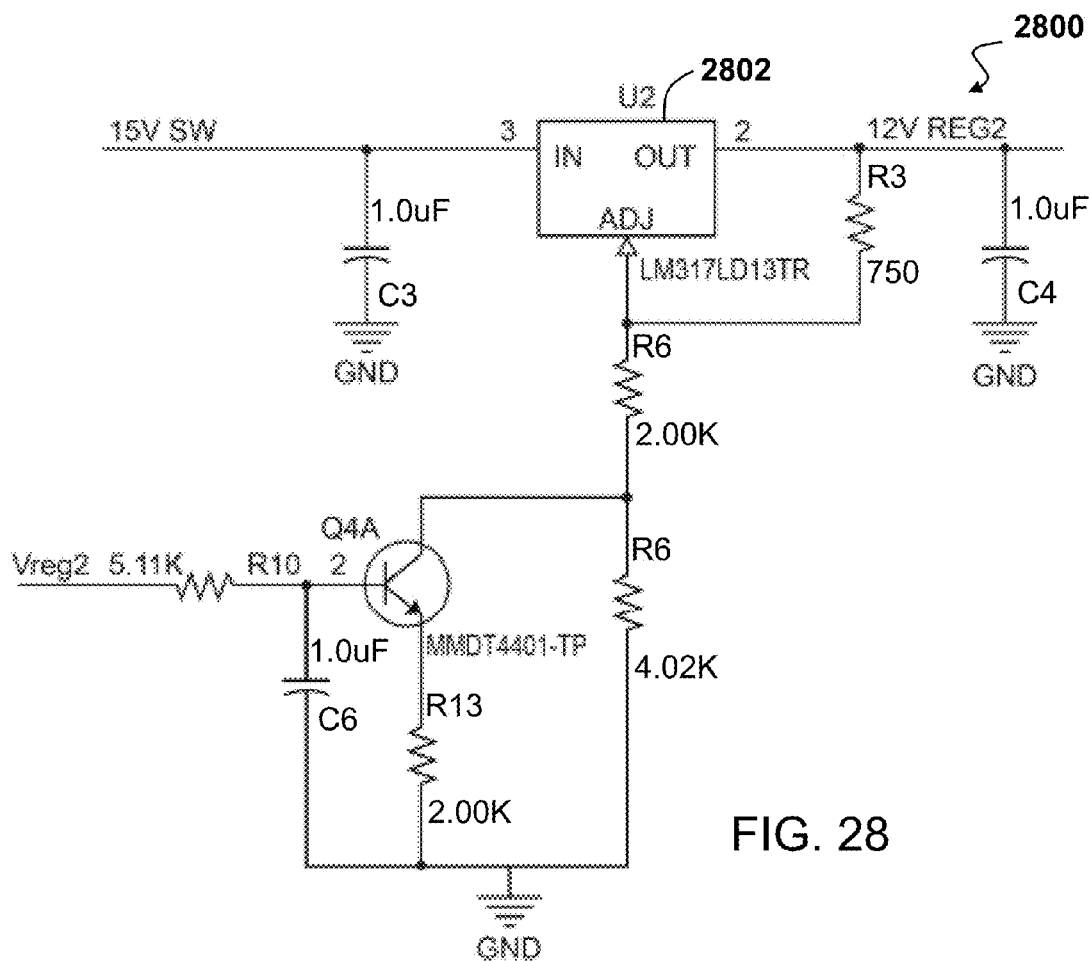
FIG. 28 depicts a circuit of an adjustable drive voltage.

FIG. 28 depicts a circuit 2800 of an adjustable drive voltage. The drive voltage for each core may be adjustable in order to compensate for core matching and drift. Each H bridge IC may supplied by a LM317 regulator 2802. The processor may reduce the output voltage of the regulator by PWM. The output voltage may be adjusted from 8-12V. Adjusting the output voltage may be used to adjust the drive voltage for the drive winding, using an adjustable voltage regulator to feed the H-bridge.

Figure 29:
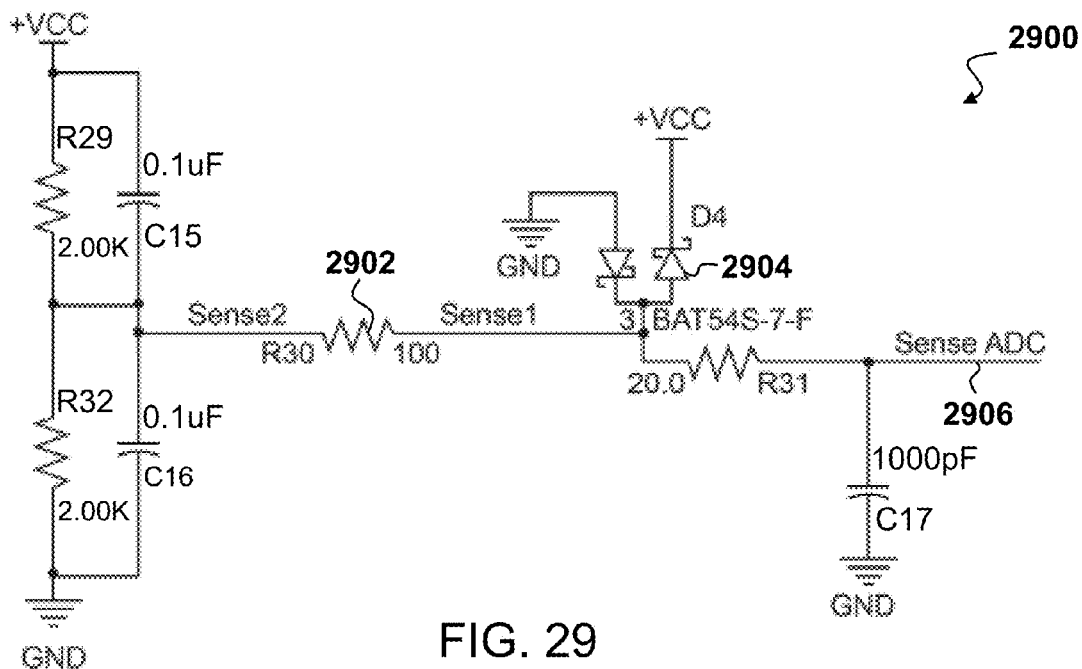
FIG. 29 depicts a circuit for signal conditioning an exemplary sense winding signal.

FIG. 29 depicts a circuit 2900 for signal conditioning an exemplary sense winding signal. A sense winding is connected to a 100 ohm burden resistor 2902, which may be biased at a VCC midpoint using a resistive/capacitive divider. The voltage across the burden resistor 2902 may spike up to +−1V during normal operation. A Schottky diode 2904 protects an ADC input 2906 from abnormal spikes. This circuit 2900 may not have GMI functionality.

Figure 30:
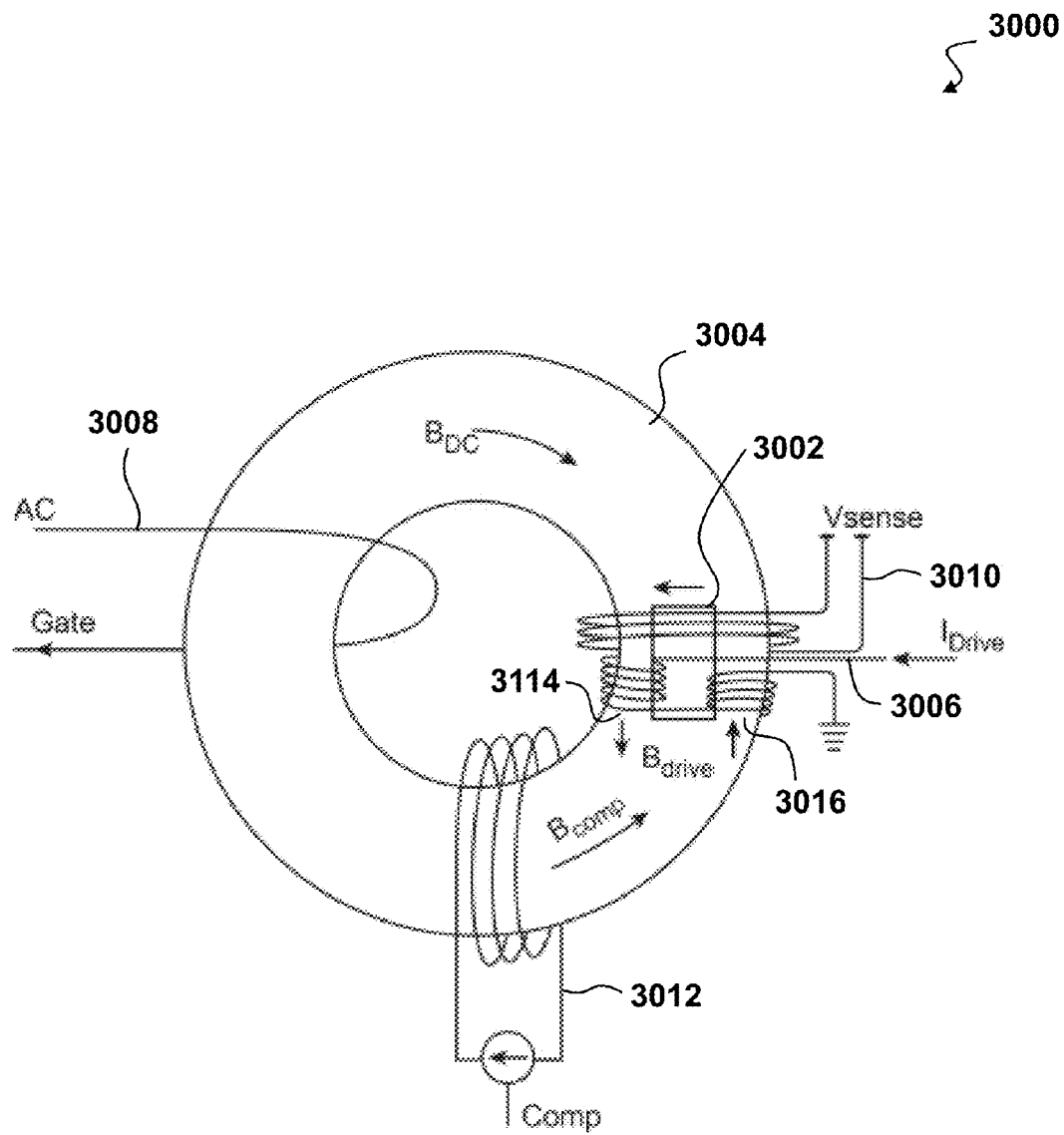
FIG. 30 depicts an exemplary alternate transformer embodiment having a window for a fluxgate.

FIG. 30 depicts an exemplary alternate transformer 3000 embodiment having a window 3002 for a fluxgate. This transformer 3000 may not have a GMI mode. The transformer 3000 may have a magnetic core 3004 of a high mu material with the window 3002 for a fluxgate cut into it. The window 3002 goes through the entire magnetic core 3004. A fluxgate drive winding 3006 may saturate the left and right halves of the window at 10 kHz with opposite polarities. The drive winding 3006 may be present on each leg 3014, 3016 of the window 3002. There may be about twenty turns of the drive winding 3006 on each leg 3014, 3016 of the window. In the presence of a magnetic field caused by DC leakage current in a utility line 3008, a pulsating voltage appears on a sense winding 3010. The leakage current adds to the flux of one of the legs 3014 and subtracts from the flux of the other leg 3016, which results on a voltage on the sense winding 3010. The sense winding 3010 may be wound across both legs of the magnetic core 3004, but not through the window 3002. The Earth's magnetic flux may not significantly affect the reading (0.1-0.2%). This transformer is small, inexpensive, has a simple installation requiring only one turn of the utility line 3008, it is EMI immune and has low emissions, it has a high bandwidth and will measure AC leakage and DC leakage, and has a low sensitivity to external magnetic fields.

A compensation winding 3012 may be driven by a microprocessor to cancel out the voltage. Any pulses on the sense winding 3010 may be provided to a microprocessor so that they may be cancelled out by the compensation winding 3012. The microprocessor may determine a leakage current on the utility line 3008 as the amount of compensation current needed in the compensation winding 3012 to cancel out the pulses on the sense winding 3010 is equal to the leakage current on the utility line 3008.

Figure 31:
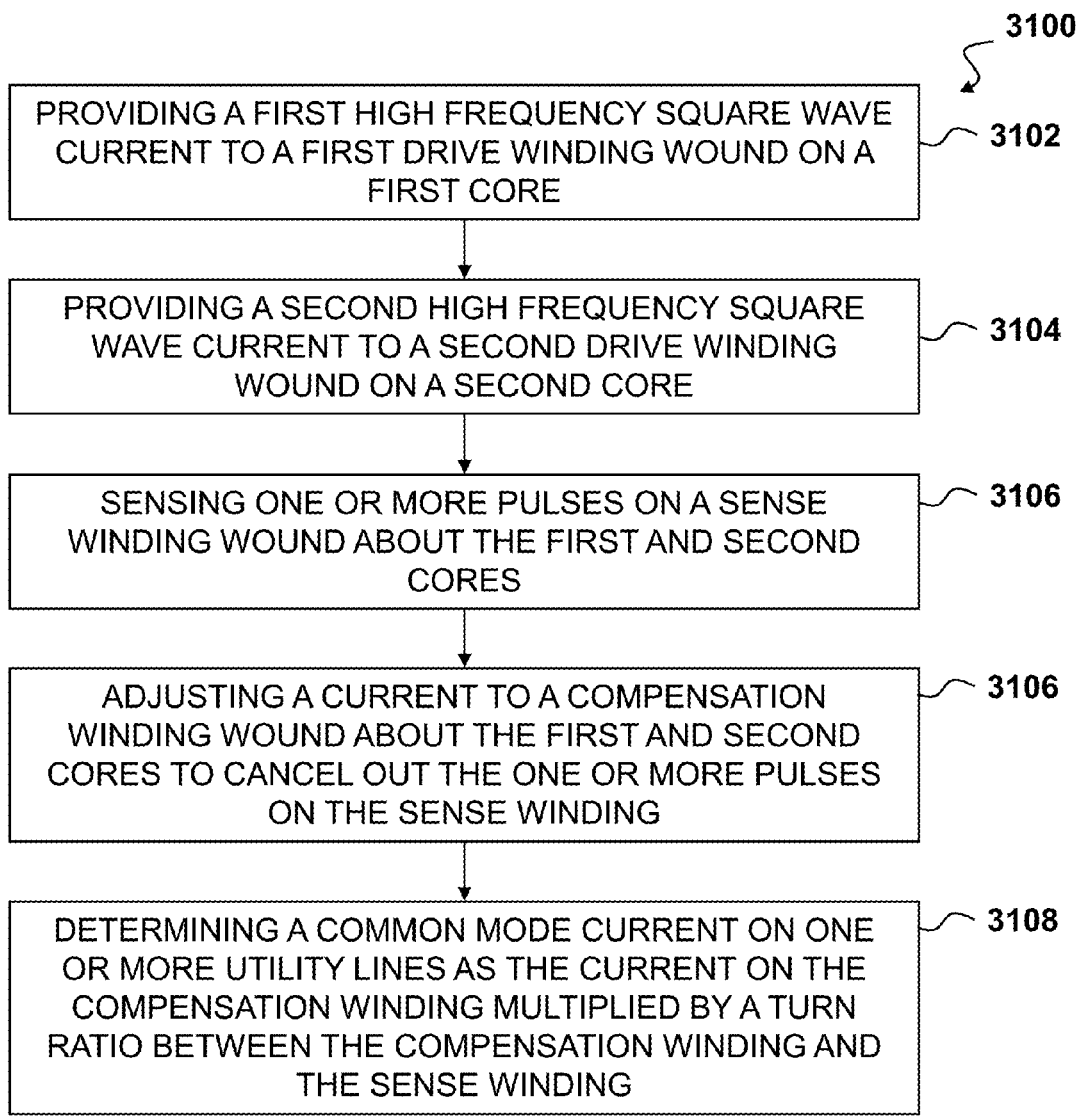
FIG. 31 depicts a flowchart of an exemplary residual current detecting (RCD) method.

FIG. 31 depicts a flowchart of an exemplary residual current detecting (RCD) method 3100. The method 3100 may include providing a first high frequency square wave current to a first drive winding wound on a first core (step 3102). The method may also include providing a second high frequency square wave current to a second drive winding wound on a second core (step 3104). The second high frequency square wave current may have an opposite polarity of the first high frequency square wave current. The method 3100 may then include sensing one or more pulses on a sense winding wound about the first and second cores (step 3106). The one or more pulses may be created by a common mode current on one or more utility lines threaded through the first and second cores. The method 3100 may then include adjusting a current to a compensation winding wound about the first and second cores to cancel out the one or more pulses on the sense winding (step 3106). The method 3100 may then include determining the common mode current on the one or more utility lines as the current on the compensation winding multiplied by a turn ratio between the compensation winding and the sense winding (step 3108).

In some embodiments, a saturation flux density of the first core may be substantially equal to the saturation flux density of the second core. In other embodiments, a saturation flux density of the first core is within 10% of the saturation flux density of the second core. If the first core has a lower saturation flux density than the second core, then the first drive winding may be provided with less current than the second drive winding such that the first core saturates at substantially the same time as the second core. One or more peaks of a rising edge of the sensed one or more pulses may be measured by a first sample and hold circuit. One or more peaks of a falling edge of the sensed one or more pulses may be measured by a second sample and hold circuit. A difference in magnitude between an average of the peaks of the rising edges and an average of the peaks of the falling edges may be determined. At least one of: the first high frequency square wave current and the second high frequency square wave current may be adjusted based on the determined difference in magnitude, and the adjusted current may compensate for a difference in a saturation flux density between the first core and the second core. The common mode current in the utility line may be at least one of: an AC residual leakage current and a DC residual leakage current.

Figure 32:
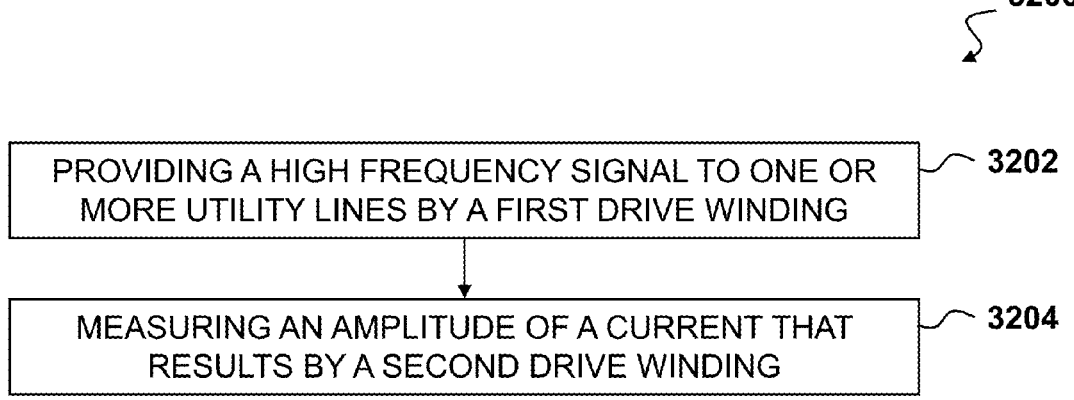
FIG. 32 depicts a flowchart of an exemplary ground monitor interrupter (GMI) method.

FIG. 32 depicts a flowchart of an exemplary ground monitor interrupter (GMI) method 3200. The method 3200 may include providing a high frequency signal to one or more utility lines by a first drive winding (step 3202). The method 3200 may also include measuring an amplitude of a current that results by the second drive winding (step 3204). The amplitude of the current that results may be proportional to a reciprocal of a ground loop impedance. The high frequency signal driven by the first drive winding may flow to a utility ground, to an electric vehicle service equipment (EVSE) through a ground wire, to ground filter capacitors of the EVSE and to ground filter capacitors of an electric vehicle (EV), to the second core, and to the first core. If a resistance of the utility ground is too high or open, then no signal may be measured by the second core.

Figure 33:
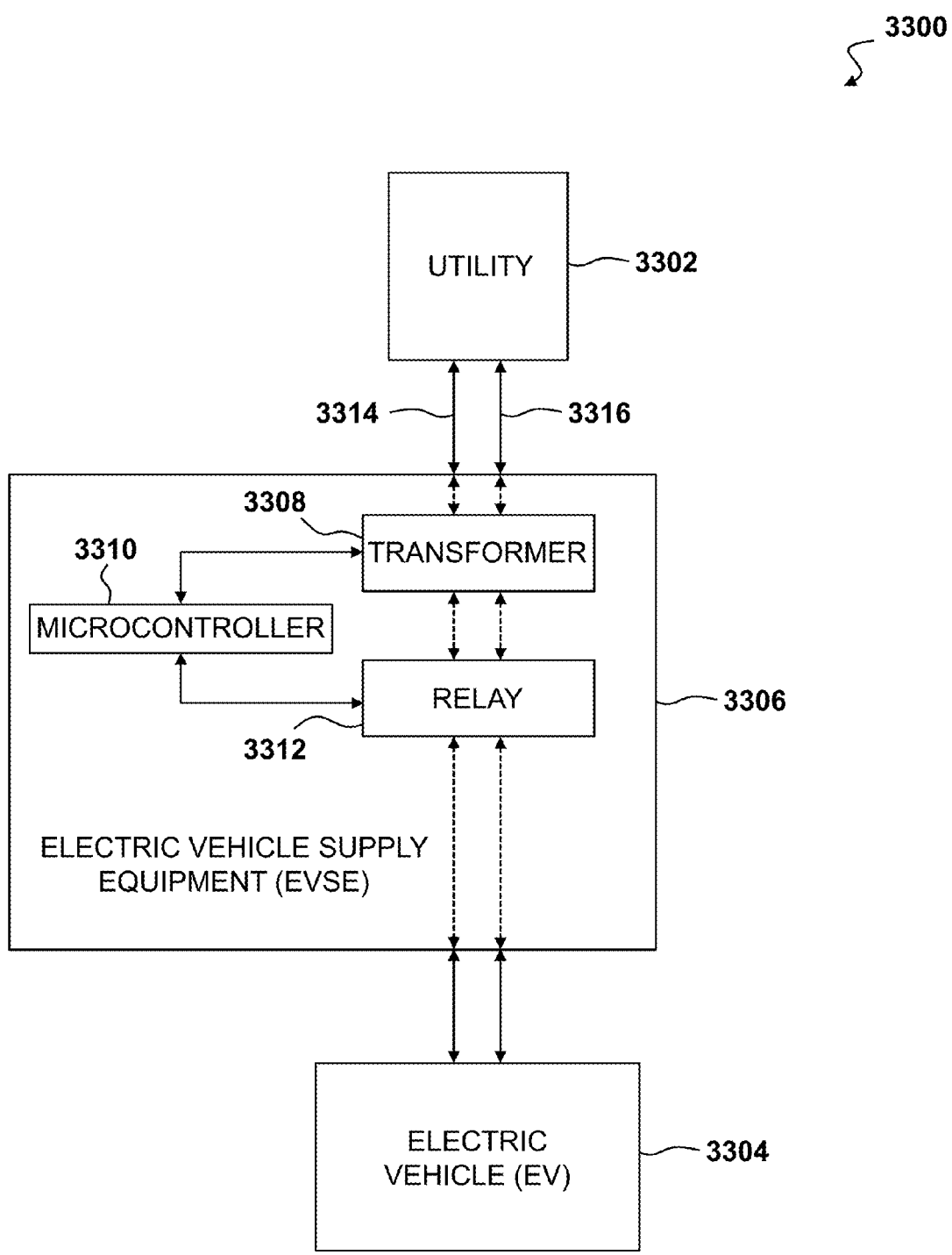
FIG. 33 depicts an exemplary system having residual current detecting (RCD) and ground monitor interrupter (GMI) to cut power between a utility and an electric vehicle if a fault is detected.

FIG. 33 depicts an exemplary system 3300 having residual current detecting (RCD) and ground monitor interrupter (GMI) to cut power between a utility 3302 and an electric vehicle (EV) 3304 if a fault is detected. The system may include an electric vehicle supply equipment (EVSE) 3306 to charge the EV 3304 with power provided by the utility 3302. While this system is described with reference to an EVSE, it may be applied to other electrical systems requiring RCD and GMI capabilities, such as a wall socket in a building. The EVSE may include a current sensing transformer 3308. The transformer may include a first core; a first drive winding wound on the first core; a second core; a second drive winding wound on the second core; a sense winding wound across the first and second cores; and a compensation winding wound across the first and second cores. The first and second cores may be arranged substantially parallel to one another. A saturation flux density of the first core may be substantially equal to the saturation flux density of the second core. One or more utility lines 3314, 3316, depicted as solid lines and dashed lines in the EVSE 3306, may be threaded through a middle of the first and second cores of the transformer 3308.

In RCD mode, a microcontroller 3310 may drive the first drive winding with a first high frequency square wave current. The microcontroller 3310 may also drive the second drive winding with a second high frequency square wave current. The second high frequency square wave current may have an opposite polarity of the first high frequency square wave current. A common mode current, such as an AC residual leakage current and/or a DC residual leakage current, in the one or more utility lines 3314, 3316 may cause one or more pulses to appear on the sense winding of the transformer 3308. These pulses may be detected by the microcontroller 3310. In response to the pulses, a current on the compensation winding of the transformer 3308 is adjusted by the microcontroller 3310 until the one or more pulses on the sense winding of the transformer 3308 are cancelled out. The microcontroller may determine the common mode current on the one or more utility lines 3314, 3316 as the adjusted current on the compensation winding of the transformer 3308 multiplied by a turn ratio between the compensation winding and the sense winding of the transformer 3308.

The microcontroller 3310 may determine if the common mode current exceeds a set threshold. The microcontroller 3310 may send a signal to a relay 3312 to cut power between the EVSE 3306 and/or the EV 3304 and the utility 3302 when the determined set threshold is exceeded. The threshold may be 6 mA for DC current and 20 mA for AC current. The thresholds may be varied based on the application and any laws set by regulatory agencies.

In GMI mode, the microcontroller 3310 may drive the first drive winding of the transformer 3308 with a high frequency signal to the one or more utility lines 3314, 3316. The second drive winding of the transformer 3308 may measure an amplitude of a current that results, which may be proportional to a reciprocal of a ground loop impedance. wherein the high frequency signal driven by the first drive winding flows to a utility ground, to the EVSE through a ground wire, to ground filter capacitors of the EVSE and to ground filter capacitors of an electric vehicle (EV), to the second core, and to the first core. No signal may be measured by the second core if a resistance of the utility ground is too high or open. A minimum threshold signal measured by the second core may be set to switch off power. In some embodiments, the minimum threshold signal may be 0.8V, which may correspond to 150-300 ohm ground loop resistance. In other embodiments, the minimum threshold signal may be set to correspond to a ground loop resistance of 1500 ohm or more.

The EVSE 3306 may switch between RCD mode and GMI mode in order to test for both conditions. In some embodiments, the EVSE 3306 may switch to GMI mode four times per second for a maximum duration of 300 us. To test for correct operation of the RCD mode prior to closing the relay 3312, the microcontroller 3310 may command a current source for the compensation winding to inject a test current. In other embodiments, a test button may included that connects a resistor between ground and line using a switch. The response time to cut power may be varied based on the application and any regulatory requirements. The response time may be a function of the leakage current magnitude. Power may be cut on leakage current in 1 ms and missing ground in 300 us. However, a quicker time to cut power may create unnecessary trips due to noise. While a microcontroller 3310 is depicted in the system 3300, one or all of its functions may be replaced by analog and logic circuitry in some embodiments as disclosed herein. Likewise, additional microcontrollers may be used to accomplish different functions.

It is contemplated that various combinations and/or sub-combinations of the specific features and aspects of the above embodiments may be made and still fall within the scope of the invention. Accordingly, it should be understood that various features and aspects of the disclosed embodiments may be combined with or substituted for one another in order to form varying modes of the disclosed invention. Further it is intended that the scope of the present invention is herein disclosed by way of examples and should not be limited by the particular disclosed embodiments described above.

What is claimed is:

1. A transformer comprising:
    a first drive winding wound on a first core, wherein the first drive winding is driven with a first high frequency square wave current;
    a second drive winding wound on a second core, wherein the second drive winding is driven with a second high frequency square wave current, and wherein the second high frequency square wave current has an opposite polarity of the first high frequency square wave current;
    a sense winding wound across the first and second cores; and
    a compensation winding wound across the first and second cores;
    wherein one or more utility lines are threaded through a middle of the first and second cores, wherein a common mode current in the one or more utility lines causes one or more pulses to appear on the sense winding, wherein a current on the compensation winding is adjusted until the one or more pulses on the sense winding are cancelled out, and wherein the common mode current on the one or more utility lines is the adjusted current on the compensation winding multiplied by a turn ratio between the compensation winding and the sense winding.

2. The transformer of claim 1, wherein a net flux through the sense winding is zero if no common mode current is present on the one or more utility lines.

3. The transformer of claim 1, wherein a saturation flux density of the first core is substantially equal to the saturation flux density of the second core.

4. The transformer of claim 1, wherein a saturation flux density of the first core is within 10% of the saturation flux density of the second core.

5. The transformer of claim 1, wherein the first core has a lower saturation flux density than the second core, and wherein the first drive winding is driven with less current than the second drive winding such that the first core saturates at substantially the same time as the second core.

6. The transformer of claim 1, wherein the first drive winding applies a high frequency signal to the one or more utility lines, wherein the second drive winding measures an amplitude of a current that results, and wherein the amplitude of the current that results is proportional to a reciprocal of a ground loop impedance.

7. The transformer of claim 1, wherein the common mode current in the utility line is at least one of: an AC residual leakage current and a DC residual leakage current.

8. The transformer of claim 1, wherein the first core is disposed substantially parallel to the second core.

9. A method comprising:
providing a first high frequency square wave current to a first drive winding wound on a first core;
providing a second high frequency square wave current to a second drive winding wound on a second core, wherein the second high frequency square wave current has an opposite polarity of the first high frequency square wave current;
sensing one or more pulses on a sense winding wound about the first and second cores, wherein the one or more pulses are created by a common mode current on one or more utility lines threaded through the first and second cores;
adjusting a current to a compensation winding wound about the first and second cores to cancel out the one or more pulses on the sense winding; and
determining the common mode current on the one or more utility lines as the current on the compensation winding multiplied by a turn ratio between the compensation winding and the sense winding.

10. The method of claim 9, wherein a saturation flux density of the first core is substantially equal to the saturation flux density of the second core.

11. The method of claim 10, wherein a saturation flux density of the first core is within 10% of the saturation flux density of the second core.

12. The method of claim 11, wherein the first core has a lower saturation flux density than the second core, and wherein the first drive winding is provided with less current than the second drive winding such that the first core saturates at substantially the same time as the second core.

13. The method of claim 11, further comprising:
measuring one or more peaks of a rising edge of the sensed one or more pulses by a first sample and hold circuit;
measuring one or more peaks of a falling edge of the sensed one or more pulses by a second sample and hold circuit;
determining a difference in magnitude between an average of the peaks of the rising edges and an average of the peaks of the falling edges; and
adjusting at least one of: the first high frequency square wave current and the second high frequency square wave current based on the determined difference in magnitude, wherein the adjusted current compensates for a difference in a saturation flux density between the first core and the second core.

14. The method of claim 9, further comprising:
providing a high frequency signal to the one or more utility lines by the first drive winding; and
measuring an amplitude of a current that results by the second drive winding, wherein the amplitude of the current that results is proportional to a reciprocal of a ground loop impedance.

15. The method of claim 14, wherein the high frequency signal driven by the first drive winding flows to a utility ground, to an electric vehicle service equipment (EVSE) through a ground wire, to ground filter capacitors of the EVSE and to ground filter capacitors of an electric vehicle (EV), to the second core, and to the first core.

16. The method of claim 15, wherein no signal is measured by the second core if a resistance of the utility ground is too high or open.

17. The method of claim 9, wherein the common mode current in the utility line is at least one of: an AC residual leakage current and a DC residual leakage current.

18. A system comprising:
a microcontroller;
a transformer comprising:
a first drive winding wound on a first core, wherein the first drive winding is driven with a first high frequency square wave current by the microcontroller;
a second drive winding wound on a second core, wherein the second drive winding is driven with a second high frequency square wave current by the microcontroller, and wherein the second high frequency square wave current has an opposite polarity of the first high frequency square wave current;
a sense winding wound across the first and second cores; and
a compensation winding wound across the first and second cores;
one or more utility lines, wherein the one or more utility lines are threaded through a middle of the first and second cores, wherein a common mode current in the one or more utility lines causes one or more pulses to appear on the sense winding, wherein a current on the compensation winding is adjusted by the microcontroller until the one or more pulses on the sense winding are cancelled out, and wherein the common mode current on the one or more utility lines is the adjusted current on the compensation winding multiplied by a turn ratio between the compensation winding and the sense winding.

19. The system of claim 18 further comprising:
an electric vehicle supply equipment (EVSE), wherein the microcontroller, transformer, and one or more utility lines are part of the EVSE;
a relay, wherein the relay is part of the EVSE;
wherein the microcontroller determines if the common mode current exceeds a set threshold, wherein the microcontroller sends a signal to a relay to cut power between the EVSE and a utility when the determined set threshold is exceeded.

20. The system of claim 19, wherein the first drive winding applies a high frequency signal to the one or more utility lines, wherein the second drive winding measures an amplitude of a current that results, wherein the amplitude of the current that results is proportional to a reciprocal of a ground loop impedance, wherein the high frequency signal driven by the first drive winding flows to a utility ground, to the EVSE through a ground wire, to ground filter capacitors of the EVSE and to ground filter capacitors of an electric vehicle (EV), to the second core, and to the first core.

* * * * *